(12) United States Patent
Okhonin et al.

(10) Patent No.: US 7,542,345 B2
(45) Date of Patent: Jun. 2, 2009

(54) MULTI-BIT MEMORY CELL HAVING ELECTRICALLY FLOATING BODY TRANSISTOR, AND METHOD OF PROGRAMMING AND READING SAME

(75) Inventors: Serguei Okhonin, Lausanne (CH); Eric Carman, Cernex (FR); Mark-Eric Jones, St-Prex (CH)

(73) Assignee: Innovative Silicon ISi SA, Lausanne (CH)

( * ) Notice: Subject to any disclaimer, the term of this patent is extended or adjusted under 35 U.S.C. 154(b) by 152 days.

(21) Appl. No.: 11/703,429

(22) Filed: Feb. 7, 2007

(65) Prior Publication Data

US 2007/0187775 A1    Aug. 16, 2007

Related U.S. Application Data

(60) Provisional application No. 60/774,275, filed on Feb. 16, 2006.

(51) Int. Cl.
*G11C 11/34* (2006.01)
(52) U.S. Cl. .................................. 365/185.18
(58) Field of Classification Search ............ 365/185.18, 365/185.03, 185.19
See application file for complete search history.

(56) References Cited

U.S. PATENT DOCUMENTS

| | | | |
|---|---|---|---|
| 3,439,214 A | 4/1969 | Kebell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |

(Continued)

FOREIGN PATENT DOCUMENTS

EP    0 030 856    6/1981

(Continued)

OTHER PUBLICATIONS

"A Capacitorless Double-Gate DRAM Cell", Kuo et al., IEEE Electron Device Letters, vol. 23, No. 6, Jun. 2002, pp. 345-347.

(Continued)

*Primary Examiner*—Son Dinh
(74) *Attorney, Agent, or Firm*—Neil A. Steinberg

(57) ABSTRACT

There are many inventions described herein as well as many aspects and embodiments of those inventions, for example, multi-bit memory cell and circuitry and techniques for reading, writing and/or operating a multi-bit memory cell (and memory cell array having a plurality of such memory cells) having one or more electrically floating body transistors in which an electrical charge is stored in the body region of the electrically floating body transistor. The multi-bit memory cell stores more than one data bit (for example, two, three, four, five, six, etc.) and/or more than two data states (for example, three, four, five, six, etc. data or logic states. Notably, the memory cell array may comprise a portion of an integrated circuit device, for example, logic device (for example, a microprocessor) or a portion of a memory device (for example, a discrete memory).

25 Claims, 26 Drawing Sheets

U.S. PATENT DOCUMENTS

| | | | |
|---|---|---|---|
| 4,791,610 A | 12/1988 | Takemae | |
| 4,954,989 A | 9/1990 | Auberton-Herve et al. | |
| 4,979,014 A | 12/1990 | Hieda et al. | |
| 5,144,390 A | 9/1992 | Matloubian | |
| 5,164,805 A | 11/1992 | Lee | |
| 5,258,635 A | 11/1993 | Nitayama et al. | |
| 5,388,068 A | 2/1995 | Ghoshal et al. | |
| 5,446,299 A | 8/1995 | Acovic et al. | |
| 5,448,513 A | 9/1995 | Hu et al. | |
| 5,466,625 A | 11/1995 | Hsieh et al. | |
| 5,489,792 A | 2/1996 | Hu et al. | |
| 5,528,062 A | 6/1996 | Hsieh et al. | |
| 5,568,356 A | 10/1996 | Schwartz | |
| 5,593,912 A | 1/1997 | Rajeevakumar | |
| 5,606,188 A | 2/1997 | Bronner et al. | |
| 5,608,250 A | 3/1997 | Kalnitsky | |
| 5,627,092 A | 5/1997 | Alsmeier et al. | |
| 5,631,186 A | 5/1997 | Park et al. | |
| 5,694,357 A * | 12/1997 | Mori | 365/185.03 |
| 5,696,718 A | 12/1997 | Hartmann | |
| 5,740,099 A | 4/1998 | Tanigawa | |
| 5,774,411 A | 6/1998 | Hsieh et al. | |
| 5,778,243 A | 7/1998 | Aipperspach et al. | |
| 5,780,906 A | 7/1998 | Wu et al. | |
| 5,784,311 A | 7/1998 | Assaderaghi et al. | |
| 5,811,283 A | 9/1998 | Sun | |
| 5,847,411 A | 12/1998 | Morii | |
| 5,877,978 A | 3/1999 | Morishita et al. | |
| 5,886,376 A | 3/1999 | Acovic et al. | |
| 5,886,385 A | 3/1999 | Arisumi et al. | |
| 5,897,351 A | 4/1999 | Forbes | |
| 5,929,479 A | 7/1999 | Oyama | |
| 5,930,648 A | 7/1999 | Yang | |
| 5,936,265 A | 8/1999 | Koga | |
| 5,939,745 A | 8/1999 | Park et al. | |
| 5,943,258 A | 8/1999 | Houston et al. | |
| 5,943,581 A | 8/1999 | Lu et al. | |
| 5,960,265 A | 9/1999 | Acovic et al. | |
| 5,968,840 A | 10/1999 | Park et al. | |
| 5,977,578 A | 11/1999 | Tang | |
| 5,982,003 A | 11/1999 | Hu et al. | |
| 6,018,172 A | 1/2000 | Hidada et al. | |
| 6,081,443 A | 6/2000 | Morishita | |
| 6,096,598 A | 8/2000 | Furukawa et al. | |
| 6,097,056 A | 8/2000 | Hsu et al. | |
| 6,111,778 A | 8/2000 | MacDonald et al. | |
| 6,121,077 A | 9/2000 | Hu et al. | |
| 6,157,216 A | 12/2000 | Lattimore et al. | |
| 6,171,923 B1 | 1/2001 | Chi et al. | |
| 6,177,300 B1 | 1/2001 | Houston et al. | |
| 6,177,708 B1 | 1/2001 | Kuang et al. | |
| 6,214,694 B1 | 4/2001 | Leobandung et al. | |
| 6,225,158 B1 | 5/2001 | Furukawa et al. | |
| 6,245,613 B1 | 6/2001 | Hsu et al. | |
| 6,252,281 B1 | 6/2001 | Yamamoto et al. | |
| 6,292,424 B1 | 9/2001 | Ohsawa | |
| 6,297,090 B1 | 10/2001 | Kim | |
| 6,300,649 B1 | 10/2001 | Hu et al. | |
| 6,320,227 B1 | 11/2001 | Lee et al. | |
| 6,333,532 B1 | 12/2001 | Davari et al. | |
| 6,350,653 B1 | 2/2002 | Adkisson et al. | |
| 6,351,426 B1 | 2/2002 | Ohsawa | |
| 6,359,802 B1 | 3/2002 | Lu et al. | |
| 6,384,445 B1 | 5/2002 | Hidaka et al. | |
| 6,391,658 B1 | 5/2002 | Gates et al. | |
| 6,403,435 B1 | 6/2002 | Kang et al. | |
| 6,421,269 B1 | 7/2002 | Somasekhar et al. | |
| 6,424,011 B1 | 7/2002 | Assaderaghi et al. | |
| 6,424,016 B1 | 7/2002 | Houston | |
| 6,429,477 B1 | 8/2002 | Mandelman et al. | |
| 6,440,872 B1 | 8/2002 | Mandelman et al. | |
| 6,441,435 B1 | 8/2002 | Chan | |
| 6,441,436 B1 | 8/2002 | Wu et al. | |
| 6,466,511 B2 | 10/2002 | Fujita et al. | |
| 6,479,862 B1 | 11/2002 | King et al. | |
| 6,492,211 B1 | 12/2002 | Divakaruni et al. | |
| 6,518,105 B1 | 2/2003 | Yang et al. | |
| 6,531,754 B1 | 3/2003 | Nagano et al. | |
| 6,538,916 B2 | 3/2003 | Ohsawa | |
| 6,544,837 B1 | 4/2003 | Divakauni et al. | |
| 6,548,848 B2 | 4/2003 | Horiguchi et al. | |
| 6,549,450 B1 | 4/2003 | Hsu et al. | |
| 6,552,398 B2 | 4/2003 | Hsu et al. | |
| 6,556,477 B2 | 4/2003 | Hsu et al. | |
| 6,560,142 B1 | 5/2003 | Ando | |
| 6,566,177 B1 | 5/2003 | Radens et al. | |
| 6,567,330 B2 | 5/2003 | Fujita et al. | |
| 6,590,258 B2 | 7/2003 | Divakauni et al. | |
| 6,590,259 B2 | 7/2003 | Adkisson et al. | |
| 6,617,651 B2 | 9/2003 | Ohsawa | |
| 6,621,725 B2 | 9/2003 | Ohsawa | |
| 6,632,723 B2 | 10/2003 | Watanabe et al. | |
| 6,650,565 B1 | 11/2003 | Ohsawa | |
| 6,714,436 B1 | 3/2004 | Burnett et al. | |
| 6,721,222 B2 | 4/2004 | Somasekhar et al. | |
| 6,825,524 B1 | 11/2004 | Ikehashi et al. | |
| 6,861,689 B2 | 3/2005 | Burnett | |
| 6,897,098 B2 | 5/2005 | Hareland et al. | |
| 6,903,984 B1 | 6/2005 | Tang et al. | |
| 6,909,151 B2 | 6/2005 | Hareland et al. | |
| 6,912,150 B2 | 6/2005 | Portman et al. | |
| 6,913,964 B2 | 7/2005 | Hsu | |
| 7,061,806 B2 | 6/2006 | Tang et al. | |
| 7,085,156 B2 | 8/2006 | Ferrant et al. | |
| 7,123,509 B2 * | 10/2006 | Ohsawa | 365/184 |
| 7,298,638 B2 * | 11/2007 | Forbes | 365/51 |
| 2001/0055859 A1 | 12/2001 | Yamada et al. | |
| 2002/0030214 A1 | 3/2002 | Horiguchi | |
| 2002/0034855 A1 | 3/2002 | Horiguchi et al. | |
| 2002/0036322 A1 | 3/2002 | Divakauni et al. | |
| 2002/0051378 A1 | 5/2002 | Ohsawa | |
| 2002/0064913 A1 | 5/2002 | Adkisson et al. | |
| 2002/0070411 A1 | 6/2002 | Vermandel et al. | |
| 2002/0072155 A1 | 6/2002 | Liu et al. | |
| 2002/0076880 A1 | 6/2002 | Yamada et al. | |
| 2002/0086463 A1 | 7/2002 | Houston et al. | |
| 2002/0089038 A1 | 7/2002 | Ning | |
| 2002/0098643 A1 | 7/2002 | Kawanaka et al. | |
| 2002/0110018 A1 | 8/2002 | Ohsawa | |
| 2002/0114191 A1 | 8/2002 | Iwata et al. | |
| 2002/0130341 A1 | 9/2002 | Horiguchi et al. | |
| 2002/0160581 A1 | 10/2002 | Watanabe et al. | |
| 2002/0180069 A1 | 12/2002 | Houston | |
| 2003/0003608 A1 | 1/2003 | Arikado et al. | |
| 2003/0015757 A1 | 1/2003 | Ohsawa | |
| 2003/0035324 A1 | 2/2003 | Fujita et al. | |
| 2003/0057487 A1 | 3/2003 | Yamada et al. | |
| 2003/0057490 A1 | 3/2003 | Nagano et al. | |
| 2003/0102497 A1 | 6/2003 | Fried et al. | |
| 2003/0112659 A1 | 6/2003 | Ohsawa | |
| 2003/0123279 A1 | 7/2003 | Aipperspach et al. | |
| 2003/0146488 A1 | 8/2003 | Nagano et al. | |
| 2003/0151112 A1 | 8/2003 | Yamada et al. | |
| 2004/0108532 A1 | 6/2004 | Forbes | |
| 2005/0001269 A1 | 1/2005 | Hayashi et al. | |
| 2005/0017240 A1 | 1/2005 | Fazan | |
| 2005/0062088 A1 | 3/2005 | Houston | |
| 2005/0063224 A1 | 3/2005 | Fazan et al. | |
| 2005/0064659 A1 | 3/2005 | Willer | |
| 2005/0105342 A1 | 5/2005 | Tang et al. | |
| 2005/0111255 A1 | 5/2005 | Tang et al. | |
| 2005/0135169 A1 | 6/2005 | Somasekhar et al. | |
| 2005/0141262 A1 | 6/2005 | Yamada et al. | |
| 2005/0141290 A1 | 6/2005 | Tang et al. | |

| | | |
|---|---|---|
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0226070 A1 | 10/2005 | Ohsawa |
| 2005/0232043 A1 | 10/2005 | Ohsawa |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2007/0023833 A1 | 2/2007 | Okhonin et al. |
| 2007/0058427 A1 | 3/2007 | Okhonin et al. |
| 2007/0064489 A1 | 3/2007 | Bauser |

FOREIGN PATENT DOCUMENTS

| | | |
|---|---|---|
| EP | 0 350 057 | 1/1990 |
| EP | 0 354 348 | 2/1990 |
| EP | 0 362 961 | 4/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 642 173 | 3/1995 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | S62-007149 A | 1/1987 |
| JP | 62-272561 | 11/1987 |
| JP | 02-294076 | 2/1991 |
| JP | 03171768 | 7/1991 |
| JP | H04-176163 A | 6/1992 |
| JP | 08213624 | 8/1996 |
| JP | H08-213624 A | 8/1996 |
| JP | 8-274277 | 10/1996 |
| JP | H08-316337 A | 11/1996 |
| JP | 09046688 | 2/1997 |
| JP | 9-82912 | 3/1997 |
| JP | 10242470 | 11/1998 |
| JP | 11-87649 | 3/1999 |
| JP | 247735 | 8/2000 |
| JP | 274221 | 9/2000 |
| JP | 389106 | 12/2000 |
| JP | 180633 | 6/2001 |
| JP | 2002-94027 | 3/2002 |
| JP | 2002-176154 | 6/2002 |
| JP | 2002-246571 | 8/2002 |
| JP | 2002-0981 | 11/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-68877 A | 3/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |

OTHER PUBLICATIONS

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effect in SOI MOS Transistors at Low Temperatures", Tack et al., IEEE Transactions on Electron Devices, vol. 37, No. 5, May 1990, pp. 1373-1382.

"Mechanisms of Charge Modulation in the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAM's", Ohsawa et al., 2003 Symposium on VLSI Circuits Digest of Technical Papers, Jun. 2003 (4 pages).

"FBC (Floating Body Cell) for Embedded DRAM on SOI", Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI FLASH Memory Cell", Lin et al., IEEE, Mar. 2000, pp. 12-15.

"Advanced TFT SRAM Cell Technology Using a Phase-Shift Lithography", Yamanaka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"Design of a SOI Memory Cell", Stanojevic et al., IEEE Proc. 21st International Conference on Microelectronics (MIEL '97), vol. 1, NIS, Yugoslavia, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Lončar et al., IEEE Proc. 22nd International Conference on Microelectronics (MIEL 2000), vol. 2, NIŠ, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15µ m SOI DRAM", Terauchi et al., Proceedings 1996 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architecture for the Low-Power Supply", Yamauchi et al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"Simulation of Floating Body Effect in SOI Circuits Using BSIM3SOI", Tu et al., Proceedings of Technical Papers (IEEE Cat No. 97TH8303), Jun. 1997, pp. 339-342.

"High-Field Transport of Inversion-Layer Electrons and Holes Including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaghi et al., IEEE Transactions on Electron Devices, vol. 44, No. 3, Mar. 1997, pp. 414-422.

"Hot-Carrier-Induced Degradation in Ultra-Thin-Film Fully-Depleted SOI MOSFETs", Yu et al., Solid-State Electronics, vol. 39, No. 12, 1996, pp. 1791-1794.

Hot-Carrier Effect in Ultra-Thin-Film (UTF) Fully-Depleted SOI MOSFET's, Yu et al., 54th Annual Device Research Conference Digest (Cat. No. 96TH8193), Jun. 1996, pp. 22-23.

"SOI MOSFET Design for All-Dimensional Scaling with Short Channel, Narrow Width and Ultra-thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE IEDM, 1994, pp. 809-812.

"A Dynamic Threshold Voltage MOSFET (DTMOS) for Very Low Voltage Operation", Assaderaghi et al., IEEE Electron Device Letters, vol. 15, No. 12, Dec. 1994, pp. 510-512.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back Si-SiO$_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys. vol. 33 (1994) pp. 365-369, Part 1, No. 1B, Jan. 1994.

"Source-Bias Dependent Charge Accumulation in P+ -Poly Gate SOI Dynamic Random Access Memory Cell Transistors", Sim et al., Jpn. J. Appl. Phys. vol. 37 (1998) pp. 1260-1263, Part 1, No. 3B, Mar. 1998.

"Suppression of Parasitic Bipolar Action in Ultra-Thin-Film Fully-Depleted CMOS/SIMOX Devices by Ar-Ion Implantation into Source/Drain Regions", Ohno et al., IEEE Transactions on Electron Devices, vol. 45, No. 5, May 1998, pp. 1071-1076.

dRAM Design Using the Taper-Isolated Dynamic RAM Cell, Leiss et al., IEEE Transactions on Electron Devices, vol. ED-29, No. 4, Apr. 1982, pp. 707-714.

"Fully Isolated Lateral Bipolar-MOS Transistors Fabricated in Zone-Melting-Recrystallized Si Films on SiO2", Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32, No. 2, Feb. 1985, pp. 258-281.

"Triple-Well nMOSFET Evaluated as a Capacitor-Less DRAM Cell for Nanoscale Low-Cost & High Density Applications", Villaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Villaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"Dynamic floating body control SOI CMOS for power managed multimedia ULSIs", F. Morishita et al., Proc. CICC, pp. 263-266, 1997.

"A 312-MHz 16-Mb Random-Cycle Embedded DRAM Macro With a Power-Down Data Retention Mode for Mobile Applications", F. Morishita et al., J. Solid-State Circuits, vol. 40, No. 1, pp. 204-212, 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

"Scalability Study on a Capacitorless 1T-DRAM: From Single-gate PD-SOI to Double-gate FINDRAM", Tanaka et al., 2004 IEEE, 4 pages.

"A Design of a Capacitorless 1-T-DRAM Cell Using Gate-induced Drain Leakage (GIDL) Current for Low-Power and High-speed Embedded Memory", Yoshida et al., 2003 IEEE, 4 pages.

"A Study of High Scalable DG-FinDRAM", Yoshida et al., IEEE Electron Device Letters, vol. 26, No. 9, Sep. 2005, pp. 655-657.

"Novel Capacitorless 1T-DRAM From Single-gate PD-SOI to Double-gate FinDRAM", ATIP Scoops, May 9, 2005, 9 pages.

"A High-Speed Clamped Bit-Line Current-Mode Sense Amplifier", T. Blalock, IEEE Journal of Solid-State Circuits, vol. 26, No. 4, Apr. 1991, pp. 542-548.

"Low-Voltage Transient Bipolar Effect Induced by Dynamic Floating-Body Charging in PD/SOI MOSFETs", Pelella et al., Final Camera Ready Art, SOI Conference, Oct. 1995, 2 pages.

"Floating-Body Concerns for SOI Dynamic Random Access Memory (DRAM)", Mandelman et al, Proceedings 1996 IEEE International SOI Conference, Oct. 1996, pp. 136-137.

"An SOI voltage-controlled bipolar-MOS device", J.P. Colinge, IEEE Transactions on Electron Devices, vol. ED-34, No. 4, Apr. 1987, pp. 848-849.

* cited by examiner

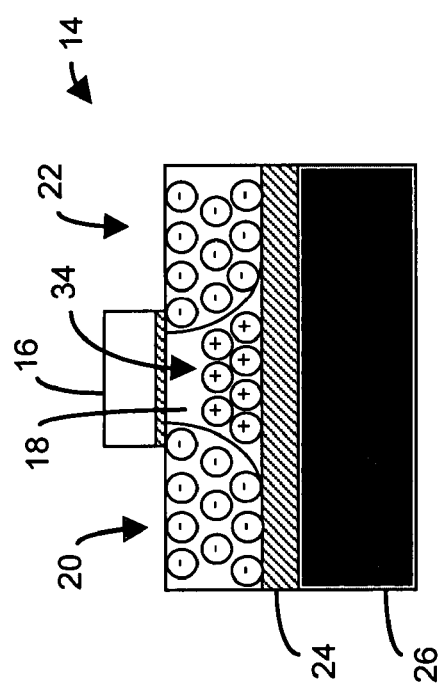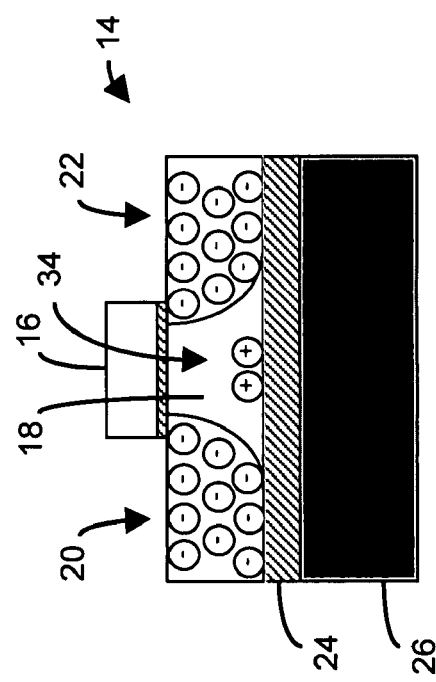

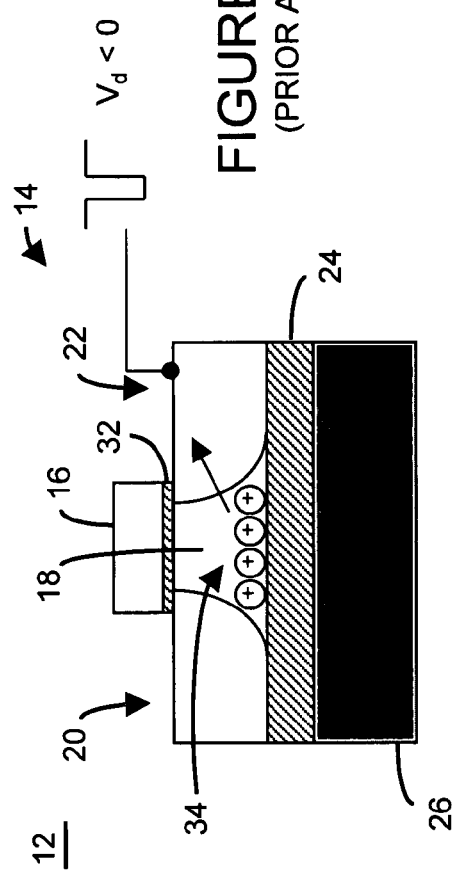
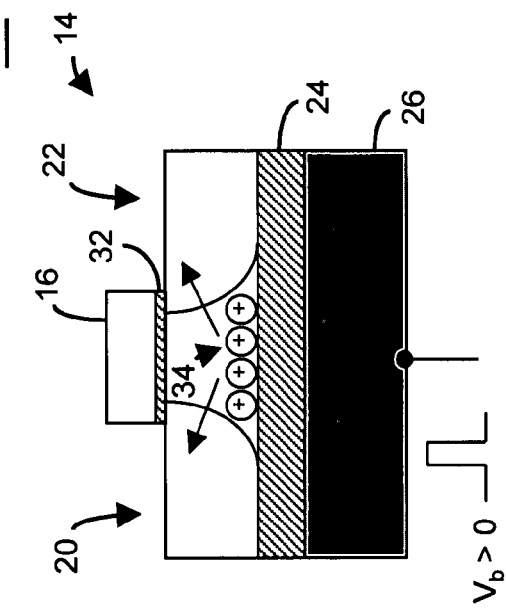
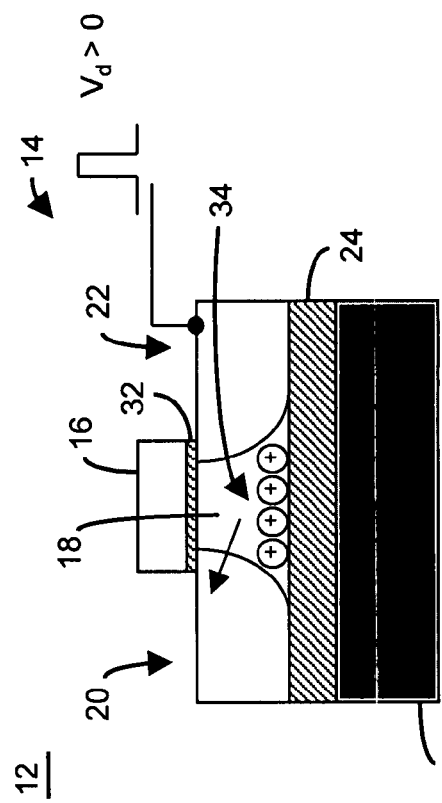
FIGURE 4A (PRIOR ART)
FIGURE 4B (PRIOR ART)
FIGURE 4C (PRIOR ART)

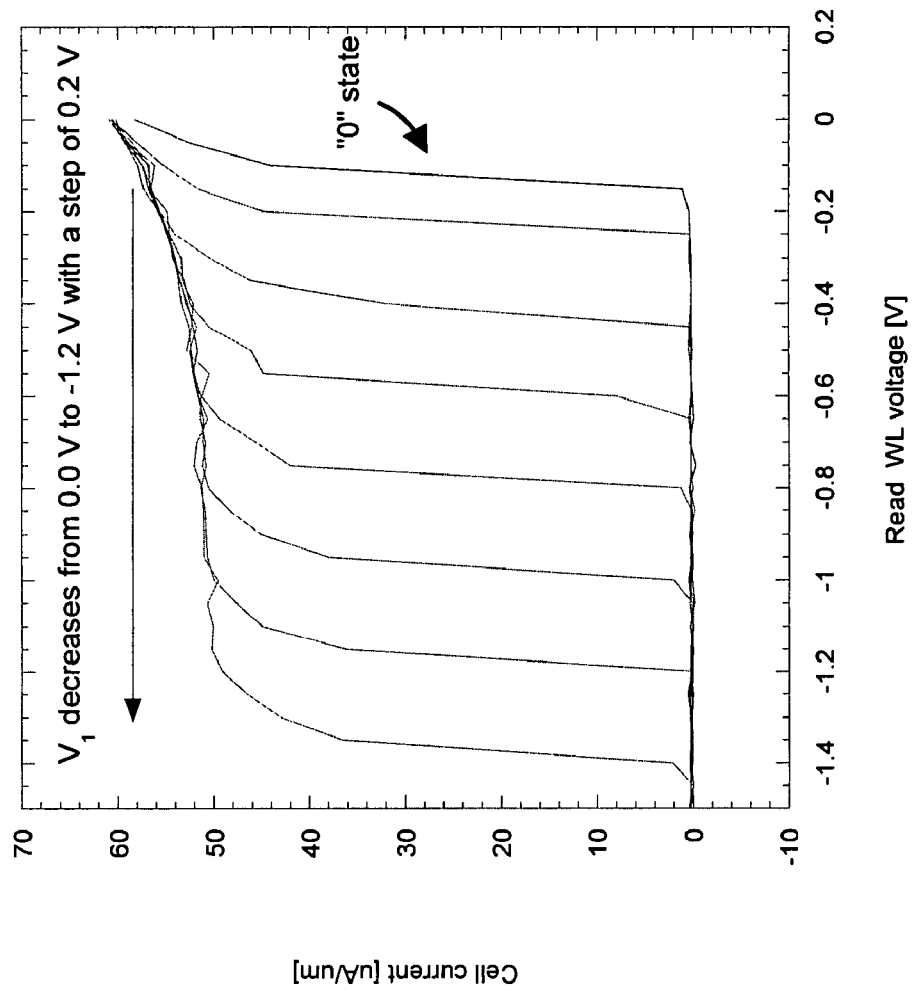
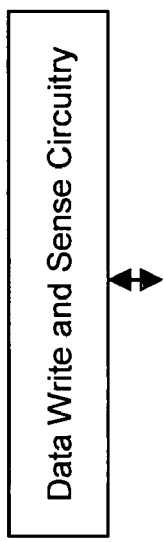
FIGURE 19

FIGURE 21A
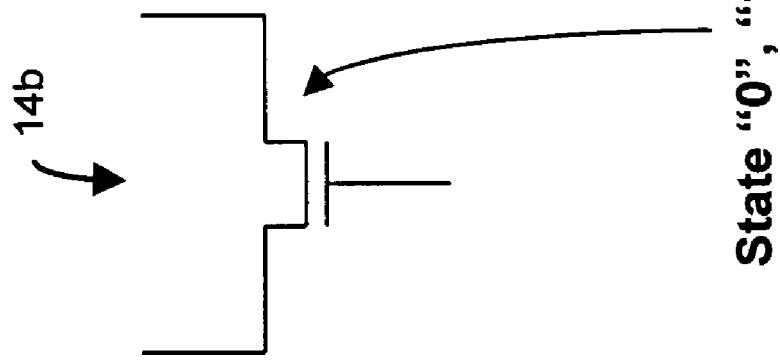
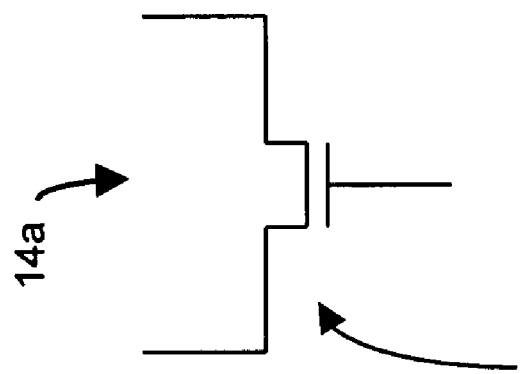

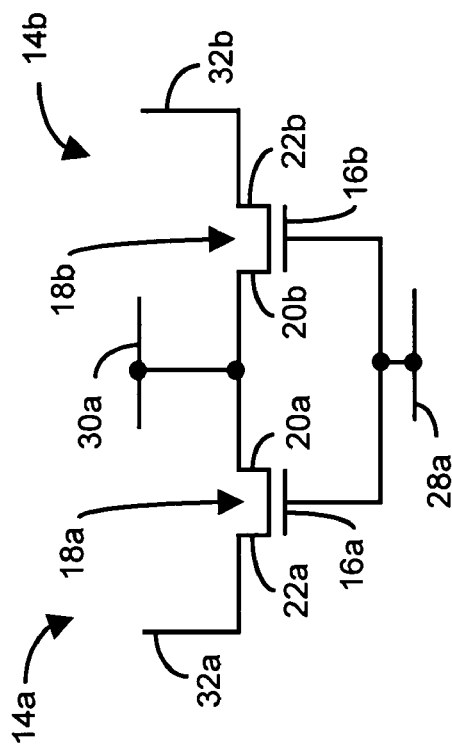
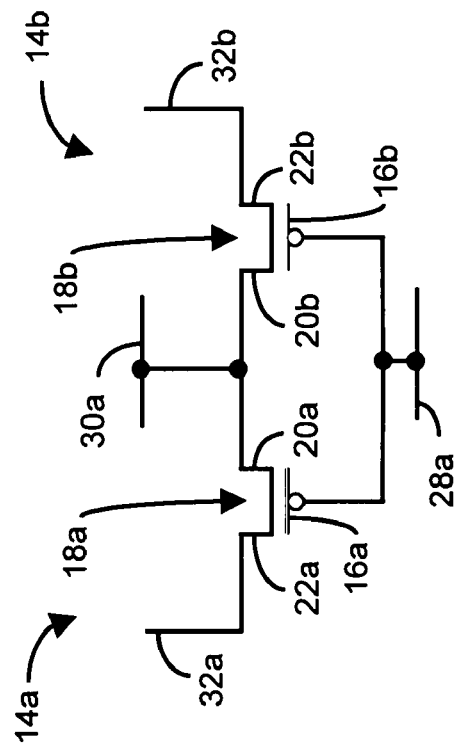

US 7,542,345 B2

MULTI-BIT MEMORY CELL HAVING ELECTRICALLY FLOATING BODY TRANSISTOR, AND METHOD OF PROGRAMMING AND READING SAME

RELATED APPLICATION

This application claims priority to U.S. Provisional Application Ser. No. 60/774,275, entitled "Multilevel Memory Cell and Method for Programming and Reading Same", filed Feb. 16, 2006; the contents of this provisional application is incorporated by reference herein in its entirety.

BACKGROUND

The present inventions relate to a multi-bit memory cell, array, architecture and device, and techniques for reading, controlling and/or operating such cell and device; and more particularly, in one aspect, to a semiconductor dynamic random access memory ("DRAM") cell, array, architecture and/or device wherein the multi-bit memory cell includes a transistor having an electrically floating body in which an electrical charge is stored.

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD), fully depleted (FD) devices, multiple gate devices (for example, double or triple gate), and FinFET.

One type of dynamic random access memory cell is based on, among other things, the electrically floating body effect of SOI transistors. (See, for example, U.S. Pat. No. 6,969,662, incorporated herein by reference). In this regard, the dynamic random access memory cell may consist of a PD or a FD SOI transistor (or transistor formed in bulk material/substrate) on having a channel, which is disposed adjacent to the body and separated therefrom by a gate dielectric. The body region of the transistor is electrically floating in view of the insulation layer (or non-conductive region, for example, in a bulk-type material/substrate) disposed beneath the body region. The state of memory cell is determined by the concentration of charge within the body region of the SOI transistor.

With reference to FIGS. 1A, 1B and 1C, in one embodiment, semiconductor DRAM array 10 includes a plurality of memory cells 12 each consisting of transistor 14 having gate 16, body region 18, which is electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the '662 Patent, including, for example, the features, attributes, architectures, configurations, materials, techniques and advantages described and illustrated therein, are incorporated by reference herein.

As mentioned above, memory cell 12 of DRAM array 10 operates by accumulating in or emitting/ejecting majority carriers (electrons or holes) 34 from body region 18 of, for example, N-channel transistors. (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 2A). Emitting or ejecting majority carriers 34 from body region 18 via, for example, forward biasing the source/body junction and/or the drain/body junction, is representative of a logic low or "0" data state. (See, FIG. 2B).

Notably, for at least the purposes of this discussion, a logic high or State "1" corresponds to an increased concentration of majority carriers in the body region relative to an unprogrammed device and/or a device that is programmed with a logic low or State "0". In contrast, a logic low or State "0" corresponds to a reduced concentration of majority carriers in the body region relative to an unprogrammed device and/or a device that is programmed with logic high or State "1".

Conventional reading is performed by applying a small drain bias and a gate bias above the transistor threshold voltage. The sensed drain current is determined by the charge stored in the floating body giving a possibility to distinguish between the states "1" and "0". A floating body memory device has two different current states corresponding to the two different logical states: "1" and "0".

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines 28 to enable the reading of the memory cells associated with such word lines. The amount of drain current is determined/affected by the charge stored in the electrically floating body region of the transistor. As such, conventional reading techniques sense the amount of the channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

In short, conventional writing programming techniques for memory cells having an N-channel type transistor often provide an excess of majority carriers by channel impact ionization (see, FIG. 3A) or by band-to-band tunneling (gate-induced drain leakage "GIDL") (see, FIG. 3B). The majority carriers may be removed via drain side hole removal (see, FIG. 4A), source side hole removal (see, FIG. 4B), or drain and source hole removal, for example, using the back gate pulsing (see, FIG. 4C).

Further, FIG. 5 illustrates the conventional reading technique. In one embodiment, the state of the memory cell may be determined by sensing the amount of the channel current provided/generated in response to the application of a predetermined voltage on the gate of the transistor of the memory cell.

The memory cell 12 having electrically floating body transistor 14 may be programmed/read using other techniques including techniques that may, for example, provide lower power consumption relative to conventional techniques. For example, memory cell 12 may be programmed, read and/or controlled using the techniques and circuitry described and illustrated in U.S. Non-Provisional patent application Ser. No. 11/509,188, filed on Aug. 24, 2006, and entitled "Memory Cell and Memory Cell Array Having an Electrically Floating Body Transistor, and Methods of Operating Same" (hereinafter "the '188 application"), which is incorporated by reference herein. In one aspect, the '188 application is directed to programming, reading and/or control methods which allow low power memory programming and provide larger memory programming window (both relative to at least the conventional programming techniques).

With reference to FIG. 6, in one embodiment, the '188 application employs memory cell 12 having electrically floating body transistor 14. The electrically floating body transistor 14, in addition to the MOS transistor, includes an intrinsic bipolar transistor (including, under certain circumstances, a significant intrinsic bipolar current). In this illustrative exemplary embodiment, electrically floating body transistor 14 is an N-channel device. As such, majority carriers are "holes".

With reference to FIG. 7, in one embodiment, the '188 application employs, writes or programs a logic "1" or logic high using control signals (having predetermined voltages, for example, Vg=0v, Vs=0v, and Vd=3v) which are applied to gate 16, source region 20 and drain region 22 (respectively) of transistor 14 of memory cell 12. Such control signals induce or cause impact ionization and/or the avalanche multiplication phenomenon. (See, FIG. 7). The predetermined voltages of the control signals, in contrast to the conventional method program or write logic "1" in the transistor of the memory cell via impact ionization and/or avalanche multiplication in the electrically floating body. In one embodiment, it is preferred that the bipolar transistor current responsible for impact ionization and/or avalanche multiplication in the floating body is initiated and/or induced by a control pulse which is applied to gate 16. Such a pulse may induce the channel impact ionization which increases the floating body potential and turns on the bipolar current. An advantage of the described method is that larger amount of the excess majority carriers is generated compared to other techniques.

Further, with reference to FIG. 8, when writing or programming logic "0" in transistor 14 of memory cell 12, in one embodiment of the '188 application, the control signals (having predetermined voltages (for example, Vg=1.5v, Vs=0v and Vd=0v) are different and, in at least one embodiment, higher than a holding voltage (if applicable)) are applied to gate 16, source region 20 and drain region 22 (respectively) of transistor 14 of memory cell 12. Such control signals induce or provide removal of majority carriers from the electrically floating body of transistor 14. In one embodiment, the majority carriers are removed, eliminated or ejected from body region 18 through source region 20 and drain region 22. (See, FIG. 8). In this embodiment, writing or programming memory cell 12 with logic "0" may again consume lower power relative to conventional techniques.

When memory cell 12 is implemented in a memory cell array configuration, it may be advantageous to implement a "holding" operation for certain memory cells 12 when programming one or more other memory cells 12 of the memory cell array to enhance the data retention characteristics of such certain memory cells 12. The transistor 14 of memory cell 12 may be placed in a "holding" state vial application of control signals (having predetermined voltages) that are applied to gate 16 and source region 20 and drain region 22 of transistor 14 of memory cell 12. In combination, such control signals provide, cause and/or induce majority carrier accumulation in an area that is close to the interface between gate dielectric 32 and electrically floating body region 18. (See, FIG. 9). In this embodiment, it may be preferable to apply a negative voltage to gate 16 where transistor 14 is an N-channel type transistor.

With reference to FIG. 10, in one embodiment of the '188 application, the data state of memory cell 12 may be read and/or determined by applying control signals (having predetermined voltages, for example, Vg=−0.5v, Vs=3v and Vd=0v) to gate 16 and source region 20 and drain region 22 of transistor 14. Such signals, in combination, induce and/or cause the bipolar transistor current in those memory cells 12 storing a logic state "1". For those memory cells that are programmed to a logic state "0", such control signals do not induce and/or cause a considerable, substantial or sufficiently measurable bipolar transistor current in the cells programmed to "0" state. (See, the '188 application, which, as noted above, is incorporated by reference).

As mentioned above, the reading may be performed using positive voltages applied to word lines 28. As such, transistors 14 of device 10 are periodically pulsed between a positive gate bias, which (1) drives majority carriers (holes for N-channel transistors) away from the interface between gate insulator 32 and body region 18 of transistor 14 and (2) causes minority carriers (electrons for N-channel transistors) to flow from source region 20 and drain region 22 into a channel formed below gate 16, and the negative gate bias, which causes majority carriers (holes for N-channel transistors) to accumulate in or near the interface between gate 16 and body region 18 of transistor 14.

With continued reference to FIGS. 11 and 12, in this exemplary embodiment of the '188 application, control signals having predetermined amplitudes may be applied to memory cells 12b and 12c to write or program logic state "0" therein. In this exemplary embodiment, the source pulse may be applied to source region 20 of memory cells 12b and 12c before the gate pulse is applied to gate 16 of memory cells 12b and 12c, or simultaneously thereto, or after the gate pulse is applied to gate 16 of memory cells 12b and 12c. In this exemplary embodiment, a drain pulse (0.5V amplitude in this example) is applied to drain regions 22 of memory cells 12b and 12d to prevent, prohibit, limit and/or retard a bipolar current (if any) from causing or generating a sufficient charge in the floating body region of memory cells 12b and 12c to program or write a logic state "1" into memory cells 12b and 12c. The drain pulse may be characterized as a "blocking" pulse.

From a relative timing perspective, it is preferred that the drain pulse be applied to drain region 22 of memory cells 12b and 12c for a temporal period that extends or is applied before, during and after the source and gate pulses (for example, initiates, starts, ramps, declines and/or terminates) as illustrated in FIG. 11.

Notably, with continued reference to FIGS. 11 and 12, for those unselected memory cells (i.e., the memory cells coupled to word lines $28_{i+1}$, $28_{i+2}$ and $28_{i+3}$), a holding condition may be applied or established to prevent, minimize or avoid disturbance of the data state of, or charge stored in the unselected memory cells. In this regard, a voltage (for example, −1.2V) may be applied to gates 16 of the unselected memory cells and a voltage (for example, 0V) may be applied to source regions 20 and drain regions 22 of the unselected memory cells to prevent, minimize or avoid disturbance of the data state in the unselected memory cells during the programming or writing operation. Under these conditions, the data state of the unselected memory cells is unaffected (or substantially unaffected) by the programming of or writing to selected memory cells 12a-d.

With reference to FIGS. 11 and 13, in an exemplary embodiment described and illustrated in the '188 application, control signals having a predetermined amplitude may be selectively applied to a row of memory cells (for example, memory cells 12a-d) to read the data state in each of the selected memory cells 12a-12d. In this exemplary embodiment, a voltage pulse of 3V may be applied to source region 20, and a voltage pulse of −0.5V may be applied to gate 16 of memory cells 12a-d. In this embodiment, the source pulse may be applied to source region 20 before application of the gate pulse to gate 16, simultaneously thereto, or after the gate pulse is applied to gate 16. Further, the source pulse may cease or terminate before the gate pulse, simultaneously thereto (as illustrated in FIG. 11), or after the gate pulse concludes or ceases.

Notably, for those memory cells that are not read (i.e., those memory cells coupled to word lines $28_{i+1}$, $28_{i+2}$ and $28_{i+3}$), a holding condition may be applied or established to prevent, minimize or avoid disturbance of the data state in the unselected memory cells. In this regard, a voltage (for example, −1.2V) may be applied to gates 16 of the unselected memory cells and a voltage (for example, 0V) may be applied to source regions 20 of the unselected memory cells to prevent, minimize or avoid disturbance of the data state in the unselected memory cells during the read operation. Under these conditions, the state of the unselected memory cells is unaffected (or it is substantially unaffected) during the reading of selected memory cells 12a-d.

In the '188 application, the memory cell in many embodiments is described as having two memory or data states: the high-conductive "1" state and low-conductive "0" state. Under these circumstances, the memory cell capacity is one bit per cell. In one aspect, the present inventions may store more than one bit per cell (i.e., more than two states in each memory cell). The present inventions, in other aspects, are directed to a combination of the programming/reading methods, which allow storage of multiple bits of data and/or reading of memory cells containing same.

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principle aspect, the present inventions are directed to an integrated circuit device (for example, a logic or discrete memory device) comprising a memory cell including an electrically floating body transistor (for example, an N-channel type transistor or a P-channel type transistor). The electrically floating body transistor includes a source region, a drain region, a body region disposed between the source region and the drain region, wherein the body region is electrically floating, and a gate disposed over the body region. The memory cell includes (i) a first data state which is representative of a first charge in the body region of the electrically floating body transistor, (ii) a second data state which is representative of a second charge in the body region of the electrically floating body transistor, and (ii) a third data state which is representative of a third charge in the body region of the electrically floating body transistor. The integrated circuit device further includes data write circuitry, coupled to the memory cell, to apply (i) first write control signals to the memory cell to write the first data state therein, (ii) second write control signals to the memory cell to write the second data state therein, and (iii) third write control signals to the memory cell to write the third data state therein.

In one embodiment, in response to: (1) the first write control signals applied to the memory cell, the electrically floating body transistor thereof generates a first bipolar transistor current which substantially provides the first charge in the body region of the electrically floating body transistor, and (2) the second write control signals applied to the memory cell, the electrically floating body transistor thereof generates a second bipolar transistor current which substantially provides the second charge in the body region of the electrically floating body transistor.

The first write control signals may include: (1) a first temporally changing signal applied to the gate, and (2a) a second temporally changing signal applied to the source region, or (2b) a second temporally changing signal applied to the drain region.

The first write control signals may include a first temporally changing signal applied to the source region, the second write control signals may include a second temporally changing signal applied to the source region, and the third write control signals may include a third temporally changing signal applied to the source region. In this embodiment, the first temporally changing signal may include a first voltage having a first amplitude and a second voltage having a second amplitude, the second temporally changing signal may include the first voltage having the first amplitude and a third voltage having a third amplitude, and the third temporally changing signal may include the first voltage having the first amplitude and a fourth voltage having a fourth amplitude.

In one embodiment, the first write control signals may include a first temporally changing signal applied to the drain region, the second write control signals may include a second temporally changing signal applied to the drain region, and the third write control signals may include a third temporally changing signal applied to the drain region. In this embodiment, the first temporally changing signal includes a first voltage having a first amplitude and a second voltage having a second amplitude, the second temporally changing signal includes the first voltage having the first amplitude and a third voltage having a third amplitude, and the third temporally changing signal includes the first voltage having the first amplitude and a fourth voltage having a fourth amplitude.

The signal applied to the gate may temporally change relative to the signal applied to the drain region to cause, provide, produce and/or induce the majority carriers to accumulate in a portion of the electrically floating body region that is juxtaposed or near a gate dielectric which is disposed between the gate and the electrically floating body region. Moreover, the signal applied to the gate may change or terminate before the signal applied to the drain region.

The integrated circuit device of this aspect of the inventions may include data sense circuitry, coupled to the memory cell, to sense the data state of the memory cell. In response to read control signals applied to the memory cell, the electrically floating body transistor generates a read bipolar transistor current which is representative of the data state of the memory cell and wherein the data sense circuitry determines the data state of the memory cell at least substantially based on the read bipolar transistor current. In this embodiment, the read control signals may include a signal applied to the gate, source region, and drain region to cause, force and/or induce the read bipolar transistor current which is representative of the data state of the memory cell and wherein the signal applied to the source region includes a positive voltage pulse.

Further, in this embodiment, the read control signals may include a signal applied to the gate, source region, and drain region to cause, force and/or induce the read bipolar transistor current which is representative of the data state of the memory cell and wherein the signal applied to the gate includes a negative voltage pulse.

In a second principle aspect, the present inventions are directed to an integrated circuit device (for example, a logic or discrete memory device) comprising a memory cell array including a plurality of word lines, plurality of source lines, plurality of bit lines, and plurality of memory cells arranged in a matrix of rows and columns. Each memory cell includes an electrically floating body transistor (for example, an N-channel type transistor or a P-channel type transistor), wherein the electrically floating body transistor includes a source region coupled to an associated source line, a drain region, a body region disposed between the source region and the drain region coupled to an associated bit line, wherein the body region is electrically floating, and a gate disposed over the body region and coupled to an associated word line. Each memory cell includes more than three data states, including: (i) a first data state which is representative of a first charge in the body region of the electrically floating body transistor, (ii) a second data state which is representative of a second charge in the body region of the electrically floating body transistor, (iii) a third data state which is representative of a third charge in the body region of the electrically floating body transistor; and (iv) a fourth data state which is representative of a fourth charge in the body region of the electrically floating body transistor.

The integrated circuit device of this aspect of the inventions further includes data write circuitry, coupled to each of the memory cells, to apply (i) first write (control signals to the memory cells to write the first data state therein, (ii) second write control signals to the memory cells to write the second data state therein, (iii) third write control signals to the memory cells to write the third data state therein and (iv) fourth write control signals to the memory cells to write the fourth data state therein.

In one embodiment, in response to: (1) the first write control signals applied to a predetermined memory cell, the electrically floating body transistor thereof generates a first bipolar transistor current which substantially provides the first charge in the body region of the electrically floating body transistor, (2) the second write control signals applied to the predetermined memory cell, the electrically floating body transistor thereof generates a second bipolar transistor current which substantially provides the second charge in the body region of the electrically floating body transistor, and (3) the third write control signals applied to the predetermined memory cell, the electrically floating body transistor thereof generates a third bipolar transistor current which substantially provides the third charge in the body region of the electrically floating body transistor.

In another principal aspect, the present inventions are directed to an integrated circuit device (for example, a logic or discrete memory device) comprising a memory cell array including a plurality of word lines, plurality of source lines, plurality of bit lines, and plurality of memory cells arranged in a matrix of rows and columns. Each memory cell includes an electrically floating body transistor (for example, an N-channel type transistor or a P-channel type transistor), wherein the electrically floating body transistor includes a source region coupled to an associated source line, a drain region, a body region disposed between the source region and the drain region coupled to an associated bit line, wherein the body region is electrically floating, and a gate disposed over the body region and coupled to an associated word line. Each memory cell includes more than three data states, including: (i) a first data state which is representative of a first charge in the body region of the electrically floating body transistor, (ii) a second data state which is representative of a second charge in the body region of the electrically floating body transistor, and (iii) a third data state which is representative of a third charge in the body region of the electrically floating body transistor.

The integrated circuit device of this aspect of the inventions further includes data sense circuitry, coupled to the plurality of memory cells, to sense the data state of the plurality of memory cells. In response to read control signals applied to the plurality of memory cells, the electrically floating body transistor of each memory cell generates a read bipolar transistor current which is representative of the data state of the associated memory cell and wherein the data sense circuitry determines the data state of the associated memory cell at least substantially based on the read bipolar transistor current.

In one embodiment, the read control signals include a signal applied to the gate, source region, and drain region of a transistor of a predetermined memory cell to cause, force and/or induce the read bipolar transistor current which is representative of the data state of the predetermined memory cell and wherein the signal applied to the gate of the associated transistor includes a positive voltage pulse. In another embodiment, the read control signals include a signal applied to the gate, source region, and drain region of a transistor of a predetermined memory cell to cause, force and/or induce the read bipolar transistor current which is representative of the data state of the predetermined memory cell and wherein the signal applied to the gate of the associated transistor includes a negative voltage pulse.

The integrated circuit device of this aspect of the inventions may include data write circuitry, coupled to each of the memory cells, to apply (i) first write control signals to a predetermined memory cell to write the first data state therein, (ii) second write control signals to the predetermined memory cell to write the second data state therein, and (iii) third write control signals to the predetermined memory cell to write the third data state therein. In one embodiment, in response to: (1) the first write control signals applied to the predetermined memory cell, the electrically floating body transistor thereof generates a first bipolar transistor current which substantially provides the first charge in the body region of the electrically floating body transistor, and (2) the second write control signals applied to the predetermined memory cell, the electrically floating body transistor thereof generates a second bipolar transistor current which substantially provides the second charge in the body region of the electrically floating body transistor.

Again, there are many inventions, and aspects of the inventions, described and illustrated herein. This Summary of the Inventions is not exhaustive of the scope of the present inventions. Moreover, this Summary of the Inventions is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner (which should also not be interpreted as being limited by the Summary of the Inventions). Indeed, many other embodiments, which may be different from and/or similar to, the embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIGS. 2A and 2B are exemplary schematic illustrations of the charge relationship, for a given data state, of the floating body, source and drain regions of a prior art memory cell comprised of one electrically floating body transistor (PD-SOI NMOS);

FIGS. 4A-4C are exemplary schematics and general illustrations of conventional methods to program a memory cell to logic state "0" (i.e., provide relatively fewer majority carriers by removing majority carriers from the electrically floating body of the transistor of the memory cell of FIG. 1B; majority carriers may be removed through the drain region/terminal of the transistor (FIG. 4A), the source region/terminal of the transistor (FIG. 4B), and through both drain and source regions/terminals of the transistor by using, for example, the back gate pulses applied to the substrate/backside terminal of the transistor of the memory cell (FIG. 4C));

FIG. 19 illustrates exemplary measured data obtained by using proposed programming and reading techniques according to the embodiment illustrated in FIG. 16;

FIGS. 21A-21C illustrate an exemplary memory cell, comprised of two transistors each of which are capable of storing more than two states, according to certain embodiments of certain aspects of the present inventions wherein the data or logic state of the memory cell is determined by the state of each transistor; notably, FIG. 21B illustrates an exemplary implementation of N-channel type multi-bit transistors and FIG. 21C illustrates an exemplary implementation of P-channel type multi-bit transistors.

DETAILED DESCRIPTION

Figure 14:
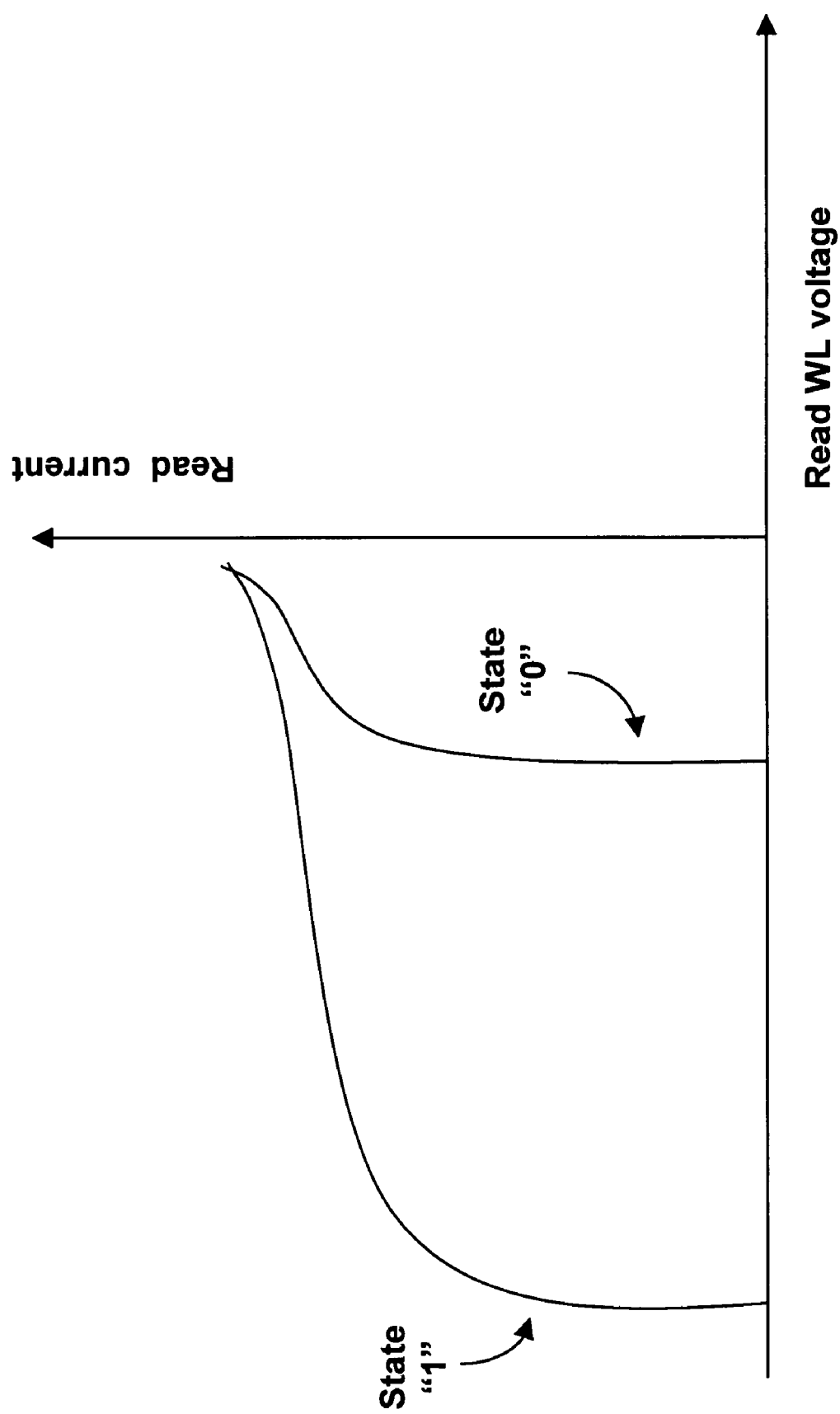
FIG. 14 illustrates a general relationship between the read current and an exemplary read operation for a two-state memory cell, for example, the memory cell described and illustrated in the '188 application.

At the outset, it should be noted that there are many inventions described herein as well as many aspects and embodiments of those inventions. The present inventions are directed to multi-bit memory cell and circuitry and techniques for reading, writing and/or operating a multi-bit memory cell (and memory cell array having a plurality of such memory cells as well as an integrated circuit device including a memory cell array) having one or more electrically floating body transistors in which an electrical charge is stored in the body region of the electrically floating body transistor. The multi-bit memory cell stores more than one data bit (for example, two, three, four, five, six, etc.) and/or more than two data states (for example, three, four, five, six, etc. data or logic states). (Compare FIGS. 14 and 15). The techniques of the present inventions may employ intrinsic bipolar transistor currents to control, write and/or read a data state in such a memory cell. In this regard, the present inventions may employ the intrinsic bipolar transistor current to control, write and/or read a data state in/of the electrically floating body transistor of the memory cell.

The present inventions, in addition thereto or in lieu thereof, may employ band-to-band tunneling to write a data state in the electrically floating body memory cell and an intrinsic bipolar transistor current generated by the electrically floating body transistor to read and/or determine the data state of the memory cell. In this embodiment, during the read operation, the data state may be determined primarily by, sensed substantially using and/or based substantially on the bipolar transistor current that is responsive to the read control signals and significantly less by the interface channel current component, which is less significant and/or negligible relative to the bipolar component.

The present inventions are also directed to semiconductor memory cell array, circuitry and device including such a memory cell and/or to implement such control and operation techniques. Notably, the memory cell and/or memory cell array may comprise a portion of an integrated circuit device, for example, logic device (such as, a microcontroller or microprocessor) or a portion of a memory device (such as, a discrete memory).

Figure 1A:
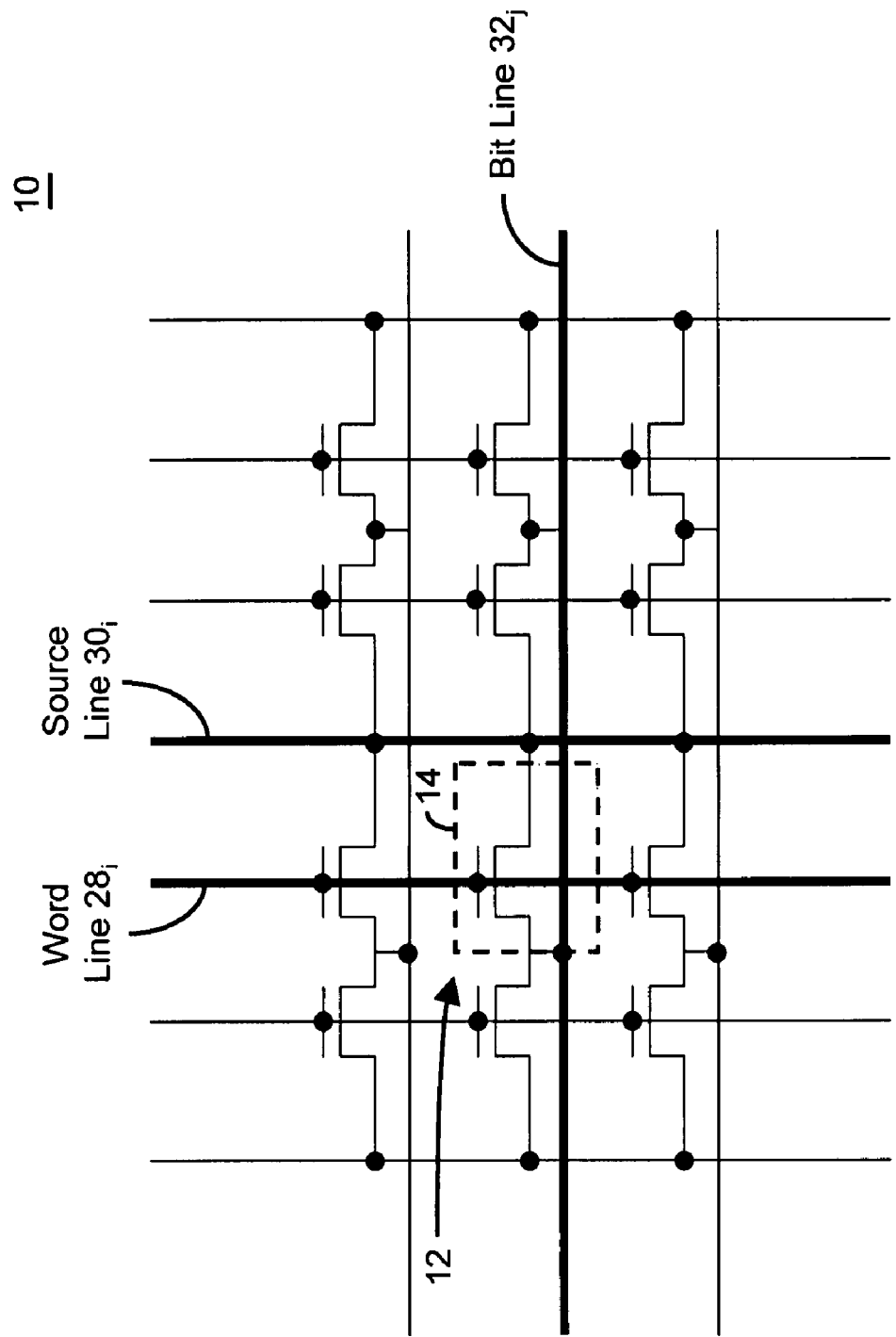
FIG. 1A is a schematic representation of a prior art DRAM array including a plurality of memory cells comprised of one electrically floating body transistor.
Figure 1B:
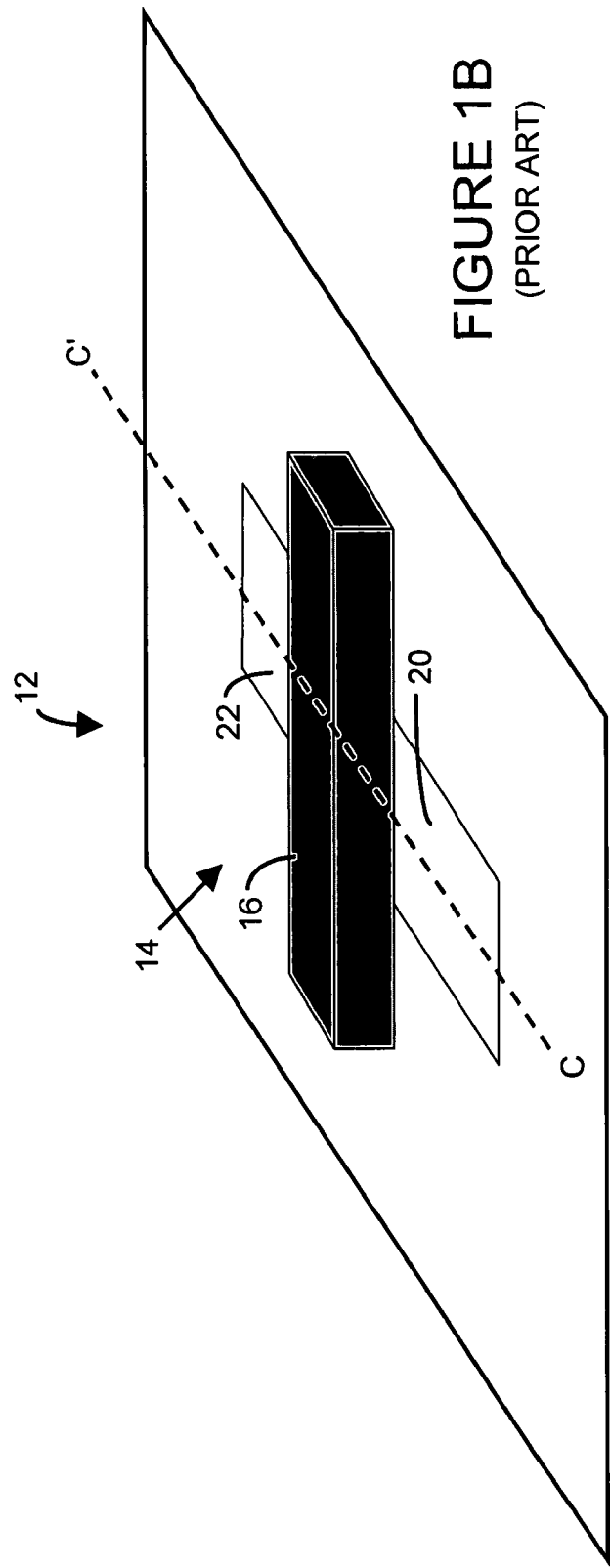
FIG. 1B is a three dimensional view of an exemplary prior art memory cell comprised of one electrically floating body transistor (PD-SOI NMOS)
Figure 1C:
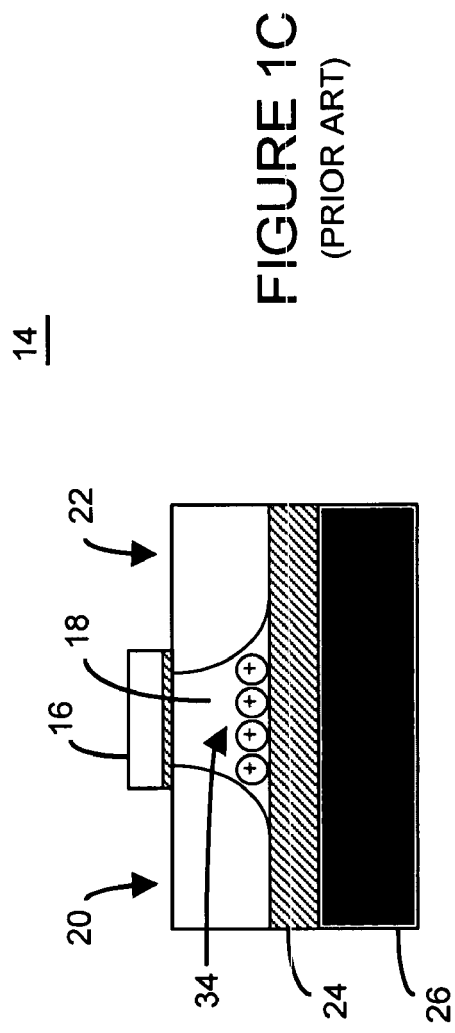
FIG. 1C is a cross-sectional view of the prior art memory cell of FIG. 1B, cross-sectioned along line C-C'.
Figure 3A:
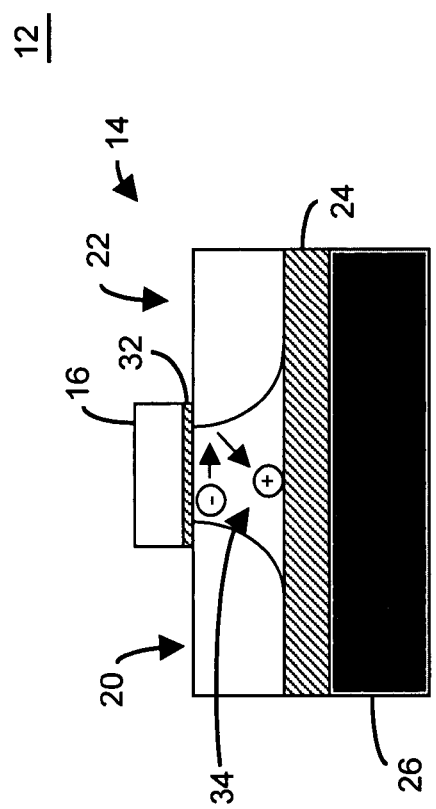
FIGS. 3A and 3B are exemplary schematic and general illustrations of conventional methods to program a memory cell to logic state "1" (i.e., generate or provide an excess of majority carrier in the electrically floating body of the transistor (an N-type channel transistor in this exemplary embodiment) of the memory cell of FIG. 1B; majority carriers in these exemplary embodiments are generated or provided by the channel electron impact ionization (FIG. 3A) and by GIDL or band to band tunneling (FIG. 3B))
Figure 3B:
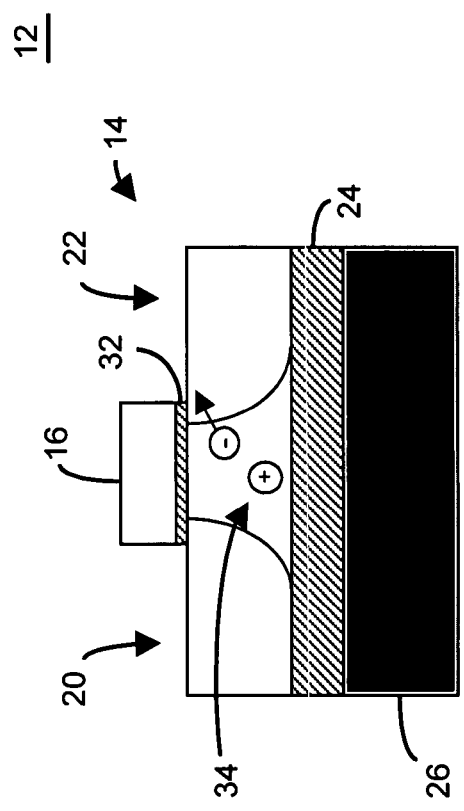
Figure 5:
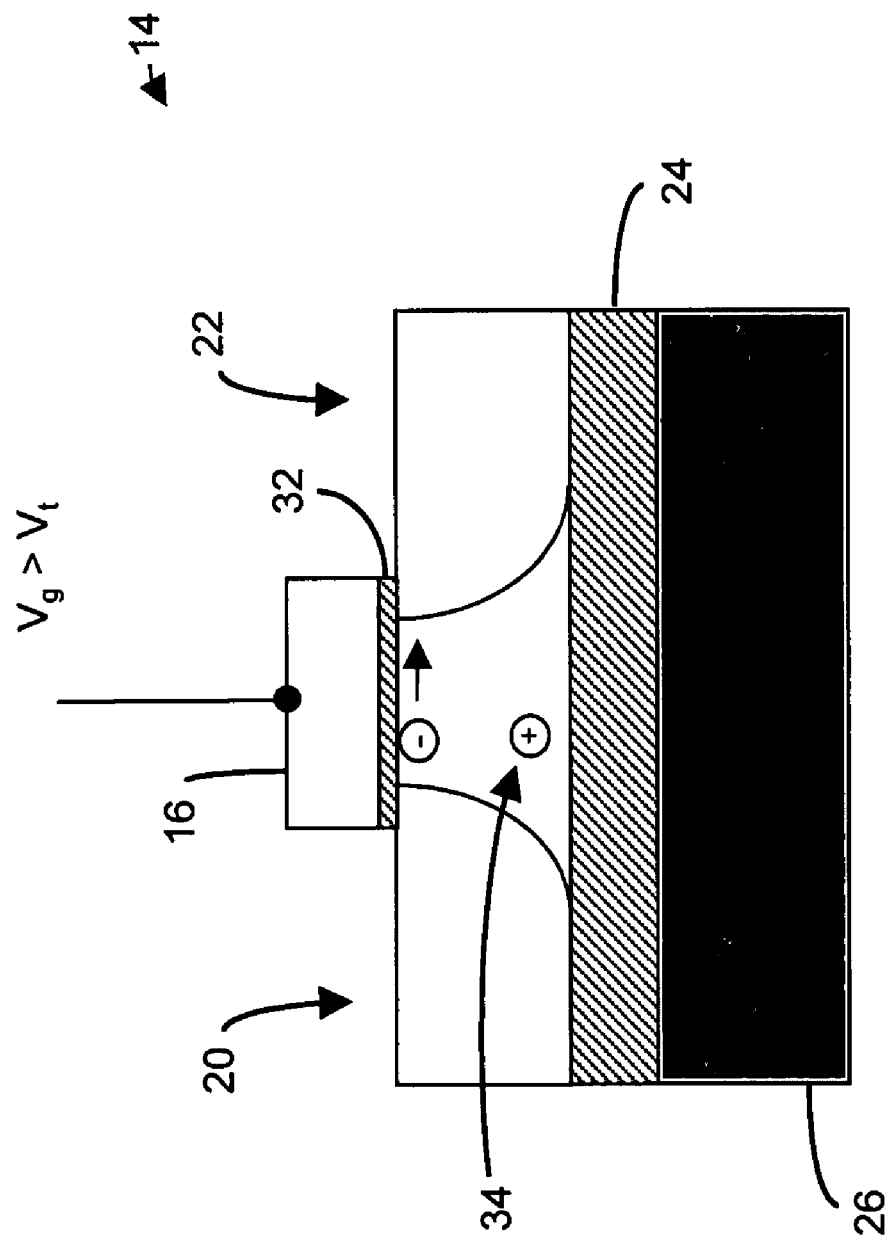
FIG. 5 illustrates an exemplary schematic (and control signal) of a conventional reading technique, the state of the memory cell may be determined by sensing the amount of the channel current provided/generated in response to the application of a predetermined voltage on the gate of the transistor of the memory cell.
Figure 6:
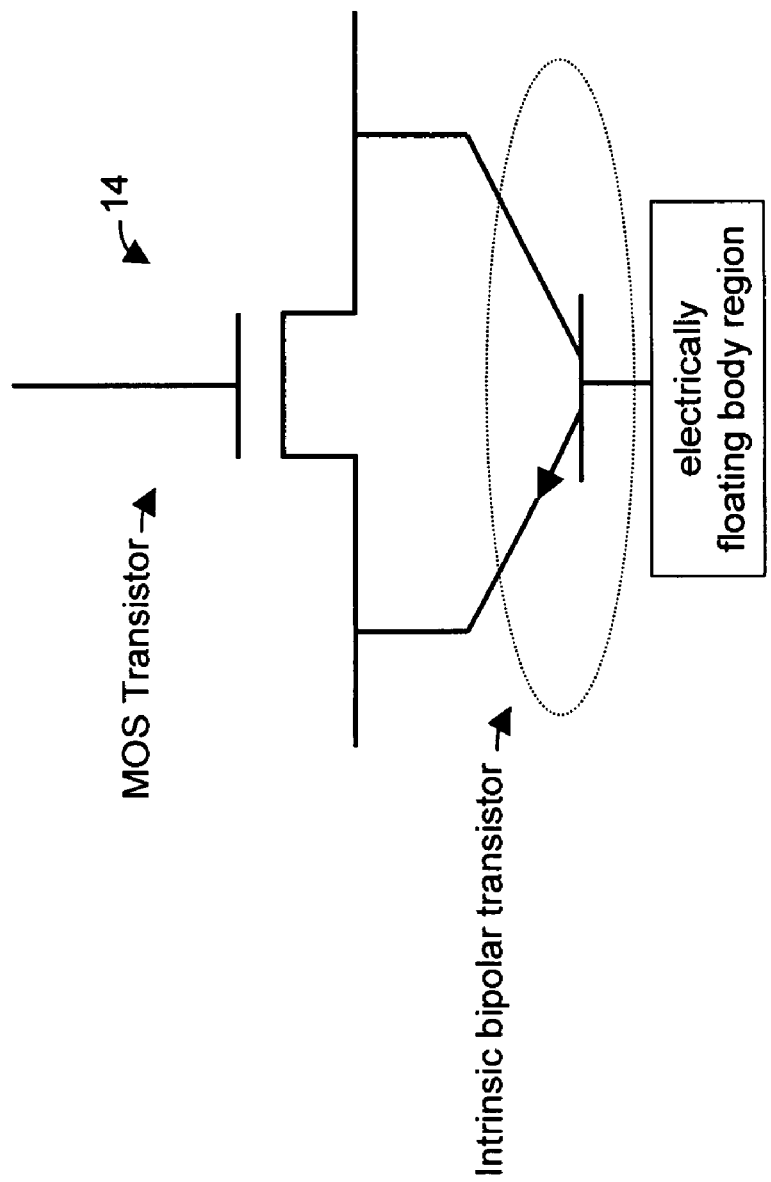
FIG. 6 is a schematic representation of an equivalent electrically floating body memory cell (N-channel type) including an intrinsic bipolar transistor in addition to the MOS transistor.
Figure 7:
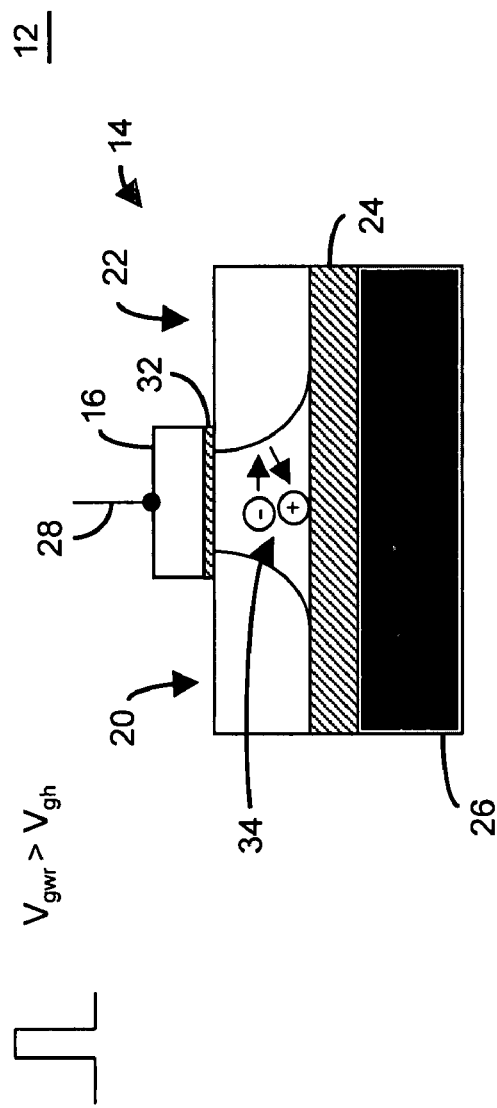
FIG. 7 illustrates an exemplary schematic (and control signal voltage relationship) of an exemplary embodiment of an aspect of the '188 application of programming a memory cell to logic state "1" by generating, storing and/or providing an excess of majority carriers in the electrically floating body of the transistor of the memory cell.
Figure 8:
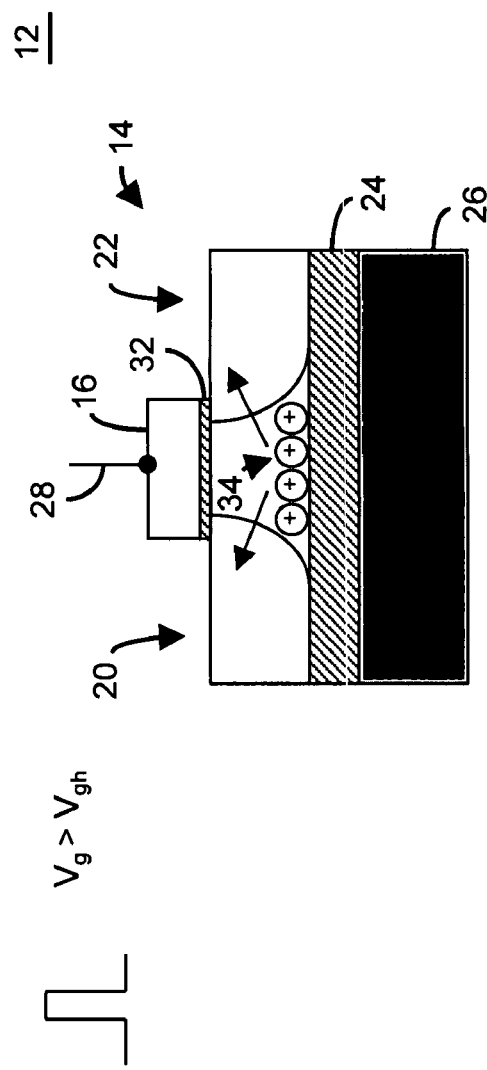
FIG. 8 illustrates an exemplary schematic (and control signals) of an exemplary embodiment of an aspect of the '188 application of programming a memory cell to a logic state "0" by generating, storing and/or providing relatively fewer majority carriers (as compared to the number of majority carriers in the electrically floating body of the memory cell that is programmed to a logic state "1") in the electrically floating body of the transistor of the memory cell, wherein the majority carriers are removed (write "0") through both drain and source terminals by applying a control signal (for example, a programming pulse) to the gate of the transistor of the memory cell.
Figure 9:
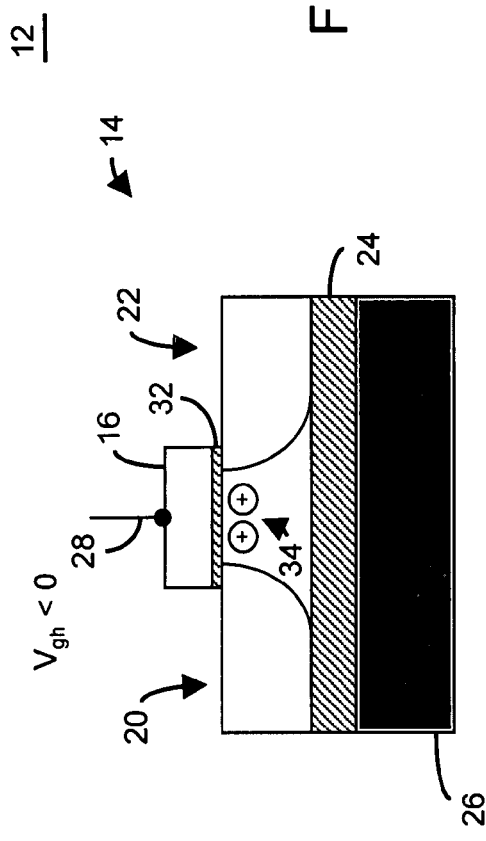
FIG. 9 illustrates an exemplary schematic (and control signals) of an exemplary embodiment of an aspect of the '188 application of holding or maintaining the data state of a memory cell.
Figure 10:
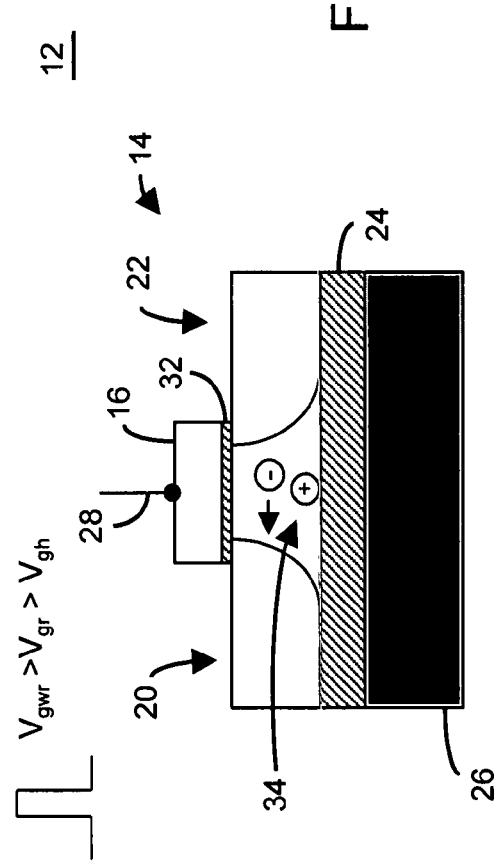
FIG. 10 illustrates an exemplary schematic (and control signals) of an exemplary embodiment of an aspect of the '188 application of reading the data state of a memory cell by sensing the amount of the current provided/generated in response to an application of a predetermined voltage on the gate of the transistor of the memory cell.
Figure 11:
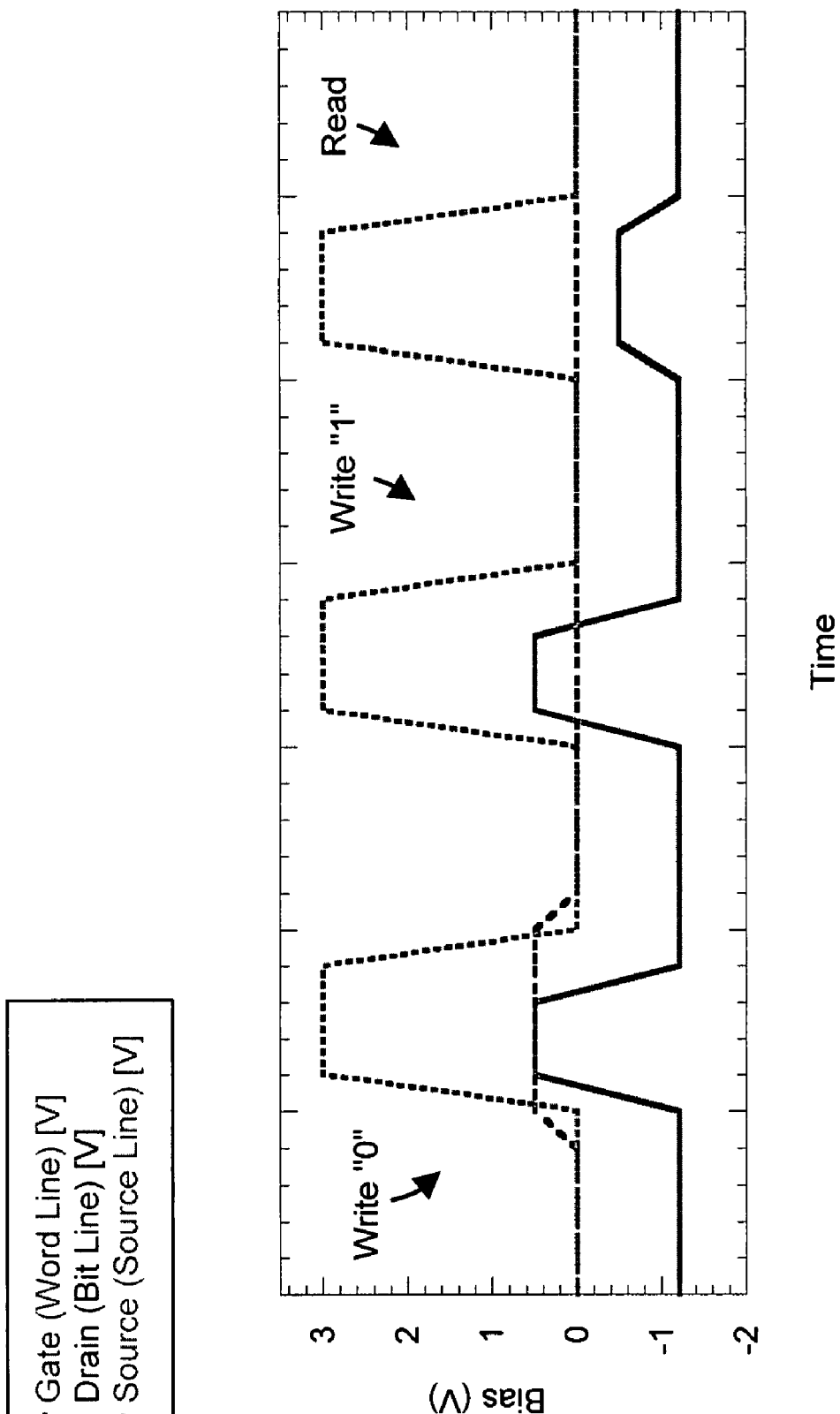
FIG. 11 illustrates exemplary timing relationships of selected write control signals to (i) program or write a logic state "1" into one or more N-channel type memory cells, (ii) program or write logic state "0" into one or more N-channel type memory cells, and (iii) read one or more N-channel type memory cells according to one embodiment of the inventions described and illustrated in the '188 application.

The present inventions employ aspects of the control, write and/or read described and illustrated in the '188 application. For example, with reference to FIG. 6, in one embodiment, electrically floating body transistor 14 controlled according to the present inventions may be schematically illustrated as including a MOS transistor "component" and an intrinsic bipolar transistor "component". In one aspect, the present inventions employ the intrinsic bipolar transistor "component" to program/write as well as read memory cell 12. In this regard, the intrinsic bipolar transistor generates and/or produces a bipolar transistor current which is employed to program/write the data state in memory cell 12 and read the data state of memory cell 12. The contents of the '188 application are incorporated by reference herein in its entirety.

The multi-bit memory cell of the present inventions, and the methods of reading, controlling and/or operating such memory cell, include a read margin that facilies implementation of a multi-bit storage and/or reading techniques. For example, with reference to FIG. 15, in one embodiment, the multi-bit memory cell is comprised of a transistor that stores four unique data or logic states wherein the memory cell (or transistor) includes a sufficient read margin which permits the data or logic states to be read and such states to be discriminated and/or differentiated. Notably, in one aspect of the invention, the unique data or logic states are determined by the amount of the majority carriers stored in the storage node (for example, the floating body region) of the transistor of the memory cell which impacts the current read from the memory cell during a read operation.

Figure 15:
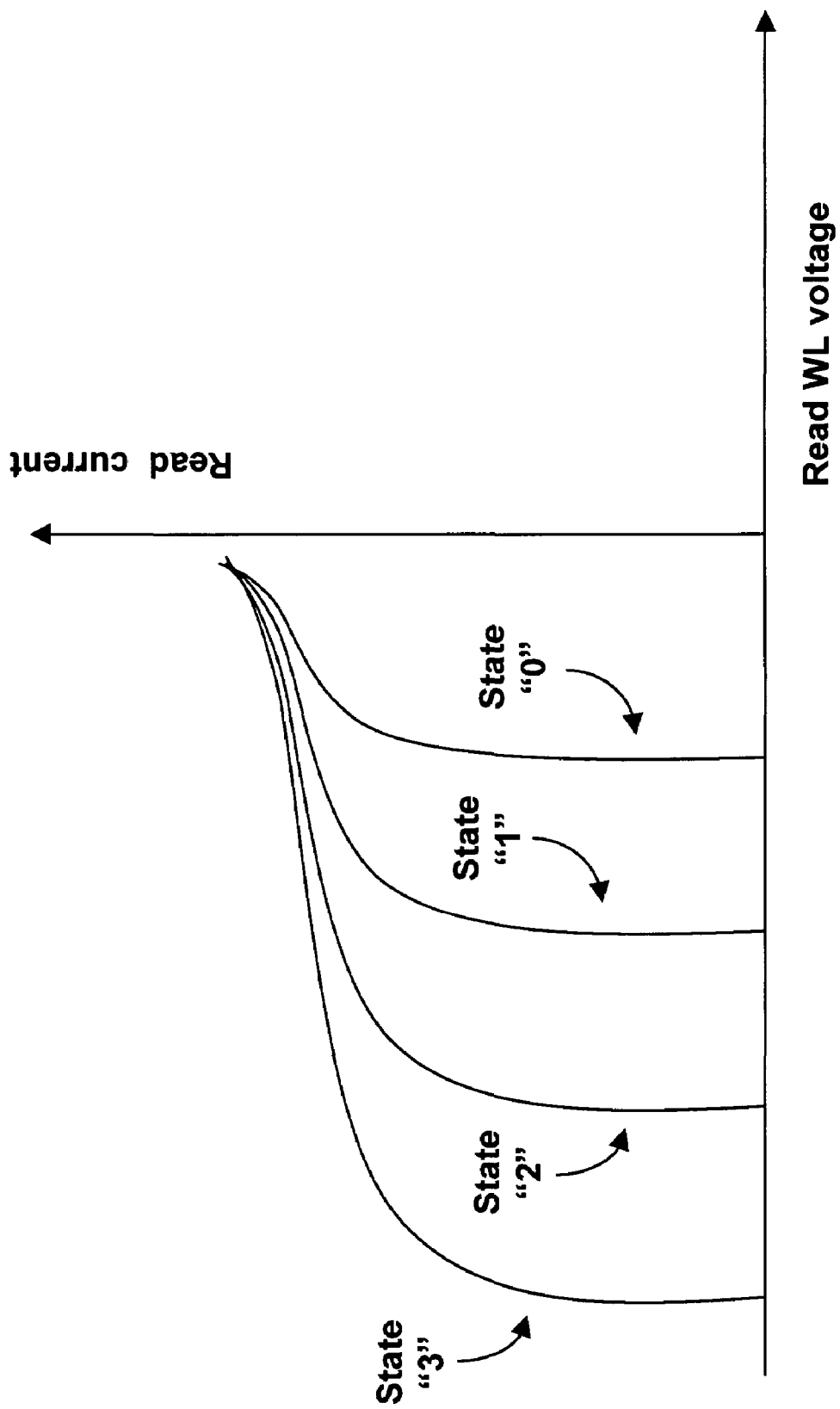
FIG. 15 illustrates a general relationship between the read current and an exemplary read operation for a multi-bit memory cell (in this exemplary embodiment, the memory cell includes four levels or states)
Figure 16:
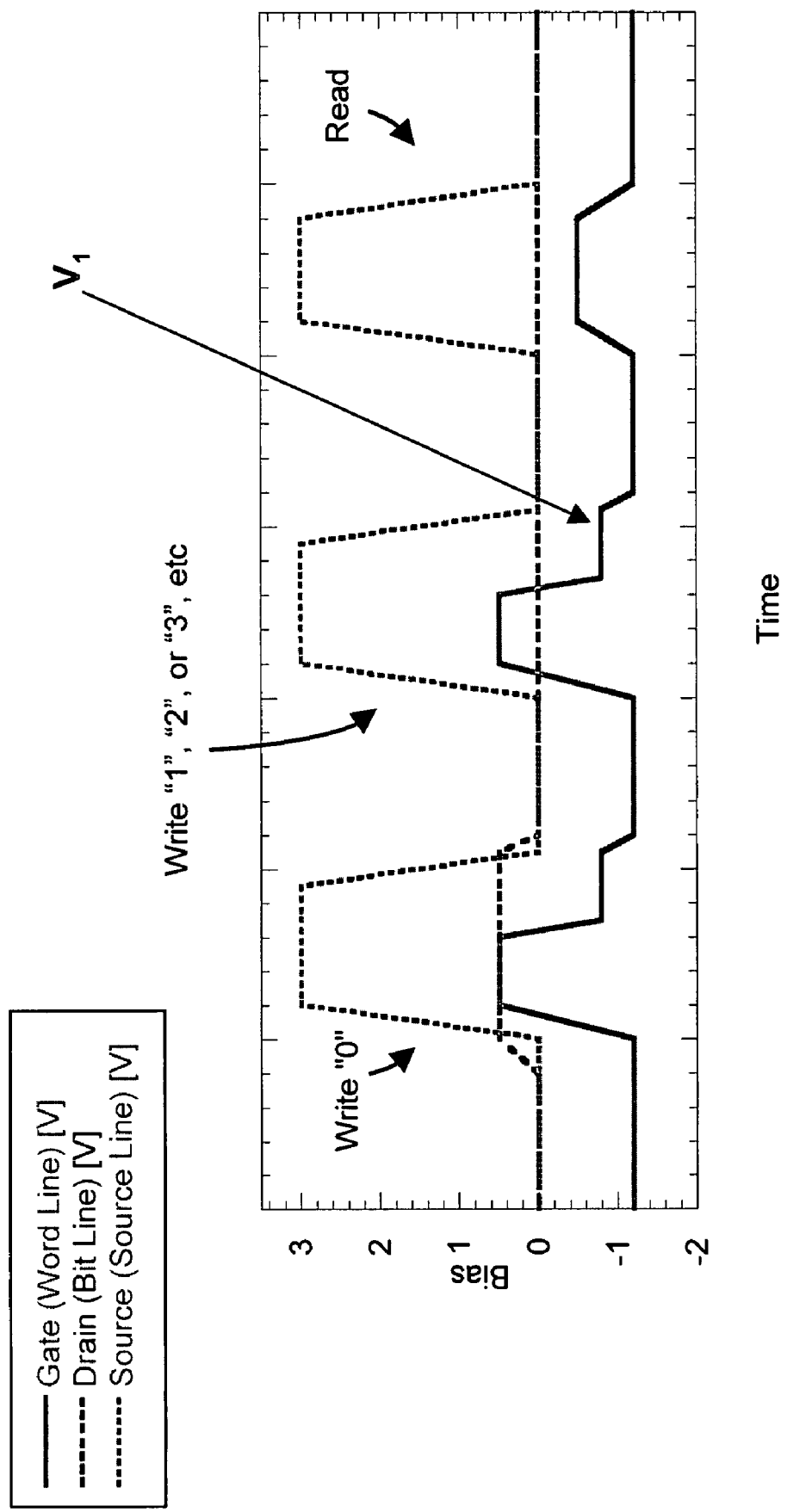
FIG. 16 illustrates exemplary timing relationships of selected write control signals to (i) program or write a logic state "0" into an N-channel type transistor comprising the multi-bit memory cell, (ii) program or write logic state "1", "2", or "3", etc. into an N-channel type transistor comprising the multi-bit memory cell, and (iii) read one or more N-channel type memory cells according to an embodiment of the present inventions.

With reference to FIGS. 15 and 16 in one aspect, the present inventions describe a method to program/write data or logic states "1", "2", "3", "4", "5", etc. In this embodiment, the memory cell may be programmed to one of more than two data states by applying a control signals having predetermined voltage amplitudes to the gate (via the associated word line $28_i$), the source region (via the associated word line $30_i$) and drain region 22 (via the associated bit line $32_j$). In response, an intrinsic bipolar transistor current or band-to-band tunneling may write or program a data state in the electrically floating body transistor of the memory cell. Here, majority carriers may be added to, stored in or removed from the electrically floating body region of the transistor of the memory cell. In this embodiment, the memory cell may be programmed to one of more than two data states by applying a predetermined voltage $V_1$ to the gate of the transistor of a predetermined memory cell. The amplitude of voltage $V_1$, in this embodiment, defines the amount of the majority carriers stored in the electrically floating body region of the transistor of the memory cell. As noted above, the data or logic state is determined by the amount of the majority carriers stored in the storage node (for example, the floating body region) of the transistor which impacts the current read from the memory cell in response to read control signals during a read operation.

Figure 17:
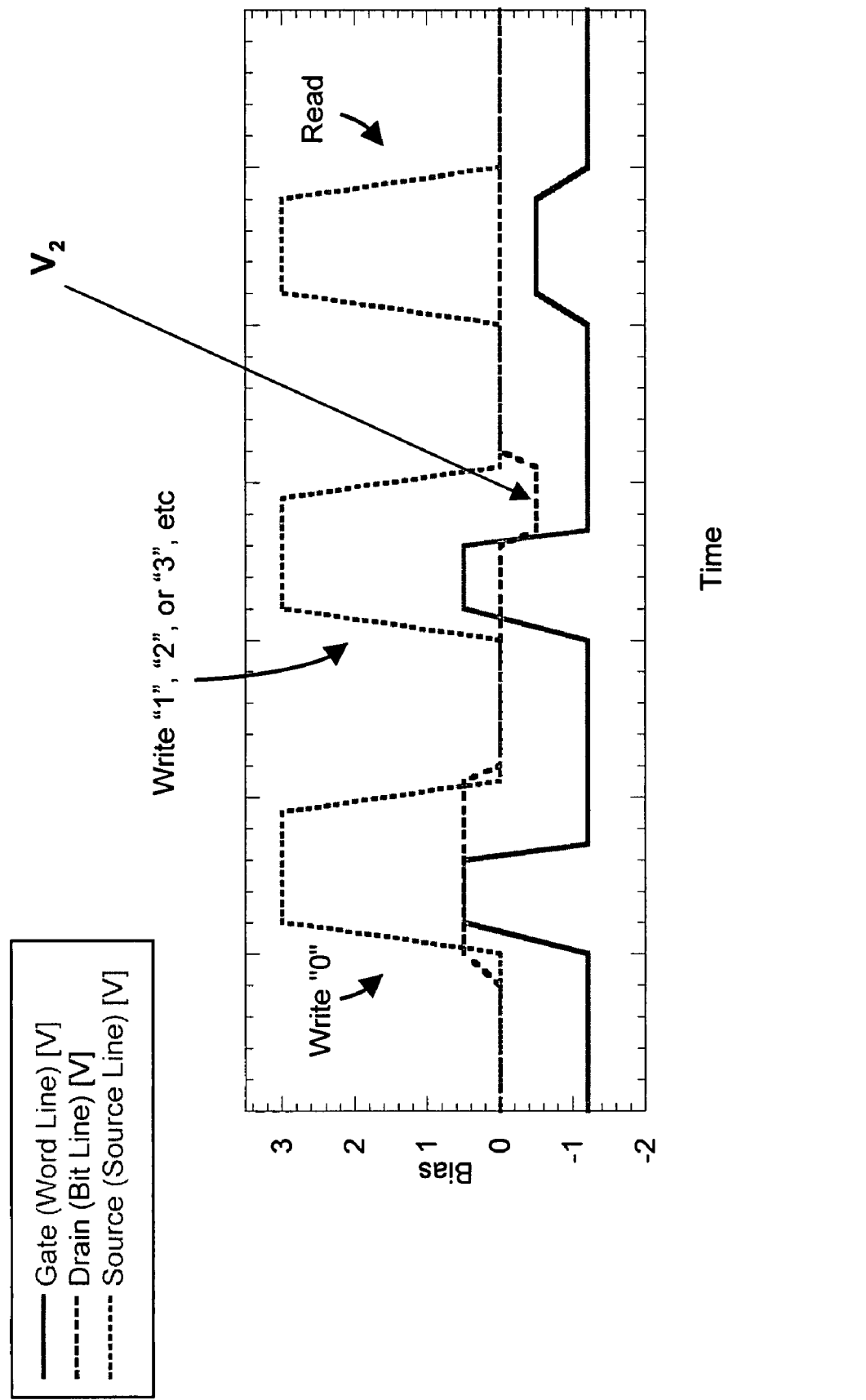
FIG. 17 illustrates exemplary timing relationships of selected write control signals to (i) program or write a logic state "0" into an N-channel type transistor comprising the multi-bit memory cell, (ii) program or write logic state "1", "2", or "3", etc. into an N-channel type transistor comprising the multi-bit memory cell, and (iii) read one or more N-channel type memory cells according to another embodiment of the present inventions.

With reference to FIGS. 15 and 17, in another embodiment the memory cell may be programmed to one of more than two data states by applying a control signal having predetermined voltage amplitudes to, among other things, the drain region of the transistor (via the associated bit line 32$_j$) of the predetermined or selected memory cell. In this embodiment, the predetermined control signal is a negative bit line voltage $V_2$. (See, FIG. 17). In response, an intrinsic bipolar transistor current or band-to-band tunneling may write or program a data state in the electrically floating body transistor of the memory cell. Again, majority carriers may be added to, stored in or removed from the electrically floating body region of the transistor of the memory cell to provide a data or logic state in the memory cell.

Figure 18:
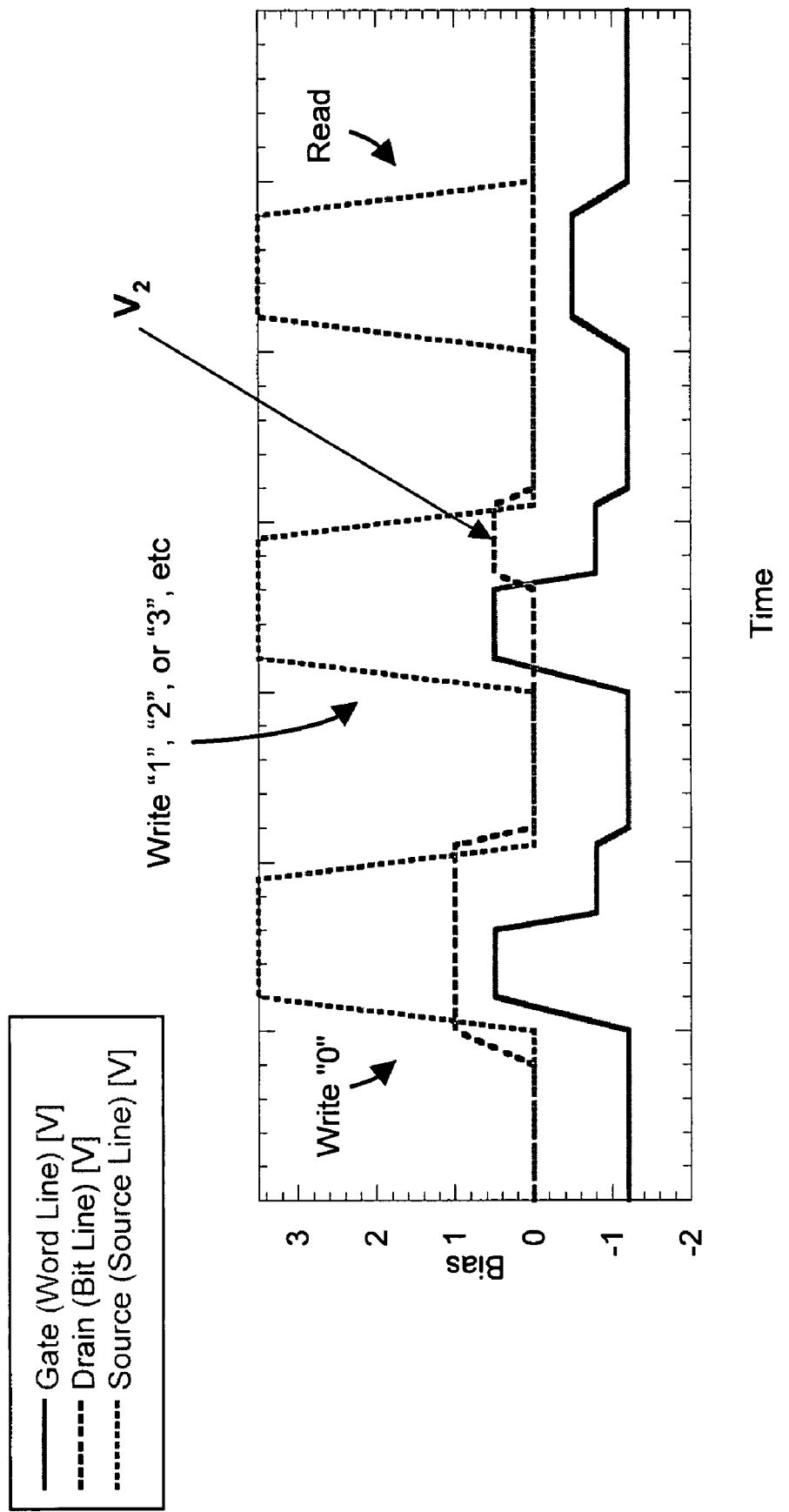
FIG. 18 illustrates exemplary timing relationships of selected write control signals to (i) program or write a logic state "0" into an N-channel type transistor comprising the multi-bit memory cell, (ii) program or write logic state "1", "2", or "3", etc. into an N-channel type transistor comprising the multi-bit memory cell, and (iii) read one or more N-channel type transistors comprising the memory cells according to another embodiment of the present inventions.

With reference to FIGS. 15 and 18, in yet another embodiment the memory cell may be programmed to one of more than two data states by applying a control signal having predetermined voltage amplitudes to, among other things, the drain region of the transistor (via the associated bit line 32$_j$) of the predetermined or selected memory cell. In this embodiment, the predetermined control signal is a positive bit line voltage $V_2$. (See, FIG. 18). Notably, as mentioned above, the data or logic state is determined by the amount of the majority carriers stored in the storage node (for example, the floating body region) of the transistor which impacts the current read from the memory cell in response to read control signals during a read operation. An intrinsic bipolar transistor current or band-to-band tunneling may write or program a data state in the electrically floating body transistor of the memory cell.

The present inventions may employ many different techniques to read one or more memory cells 12. In one embodiment, the data state of the memory cell may be read, determined, sampled and/or sensed primarily by, substantially using and/or based substantially on the bipolar transistor current that is responsive to read control signals. In this embodiment, the interface channel current component of the overall current is less significant and/or negligible relatively to the bipolar component.

In particular, with reference to FIGS. 16, 17, 18 and 19, the data state stored in a selected memory cell may be read, determined, sampled and/or sensed by applying control signals having predetermined voltage amplitudes to the gate and the source region and the drain region of the transistor (for example, Vg=−0.5v, Vs=3v and Vd=0v, respectively). Such control signals, in combination, induce and/or cause a bipolar transistor current of a certain magnitude in a transistor. The bipolar transistor current is associated with a particular logic state. (See, FIG. 19). Moreover, the bipolar transistor current may be considerably larger than a channel current which is generated in response to the read operation control signals. As such, data write and sense circuitry (for example, an n-bit analog-to-digital converter (where "n" may be equal to the number of bits stored in the memory cell; notably "n" may or may not be an integer) and/or a plurality of cross-coupled sense amplifiers), senses the data state using primarily and/or based substantially on the bipolar transistor current (the sense circuitry may be coupled to the transistor (for example, drain region via the associated bit line) of the memory cell). Notably, for those memory cells that are programmed to logic "0", the read operation control signals induce, cause and/or produce little to no bipolar transistor current (for example, a considerable, substantial or sufficiently measurable bipolar transistor current).

With reference to FIGS. 16-18, in another aspect, the memory cell may be programmed to one of more than two data states by applying a control signal having predetermined pulse widths and amplitudes to, among other things, the gate, source region and/or drain region of the transistor of the predetermined or selected memory cell. In this embodiment, the data states or levels may be programmed by controlling, adjusting and/or changing the pulse widths of the program signals (for example, the source voltage, bit line or drain voltage and/or the gate voltage).

Notably, the illustrated/exemplary voltage levels to implement the write and read operations are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.25, 0.5, 1.0 and 2.0 volts) whether one or more of the voltages (for example, the source, drain or gate voltages) become or are positive and negative.

Figure 12:
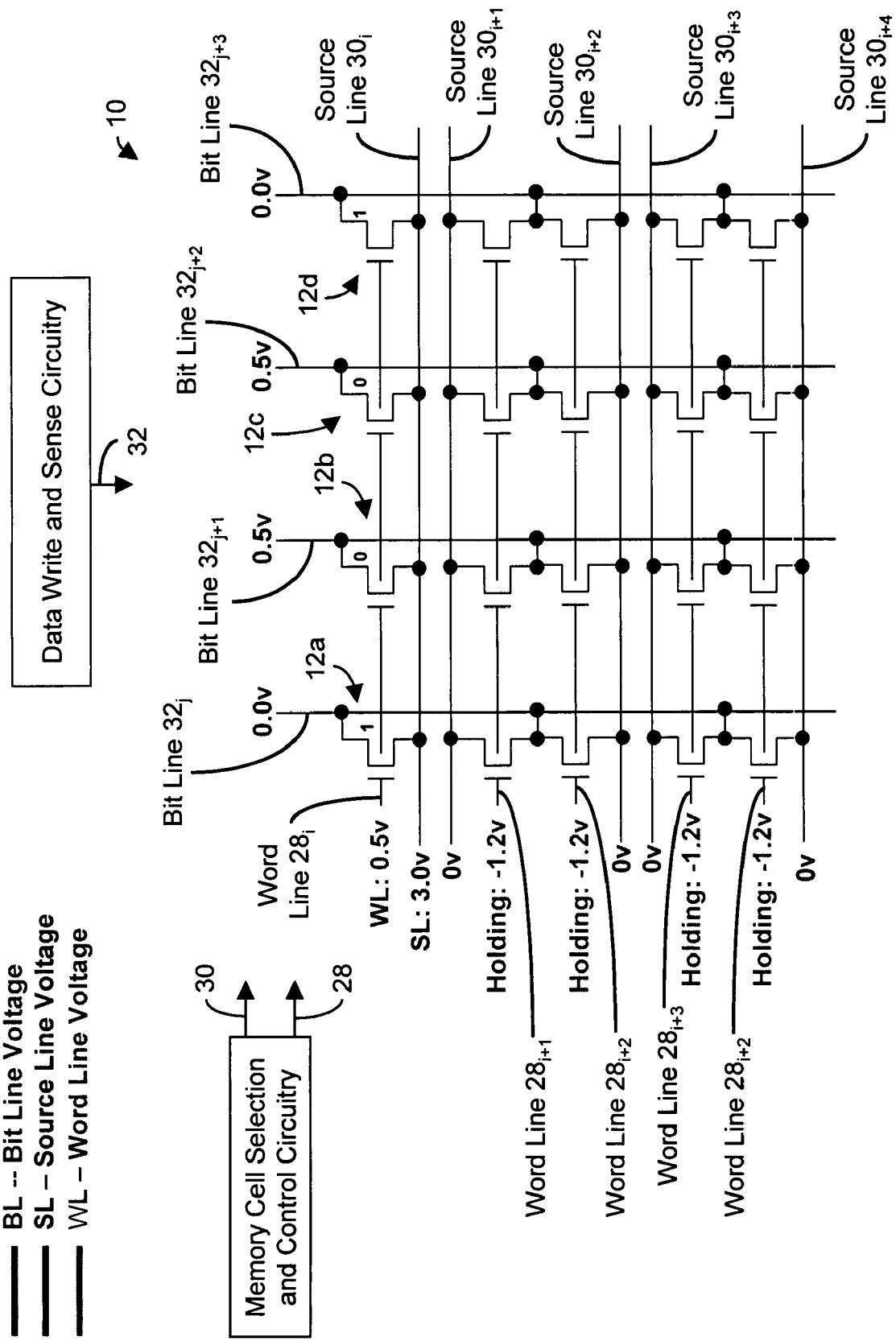
FIGS. 12 and 13 illustrate an exemplary embodiment of a memory array having a plurality of memory cells (N-channel type) and employing a separated source line configuration for each row of memory cells in conjunction with exemplary programming techniques, including exemplary control signal voltage values (FIG. 11) and exemplary reading techniques, including exemplary control signal voltage values (FIG. 12), according to certain aspects of the inventions described and illustrated in the '188 application.
Figure 13:
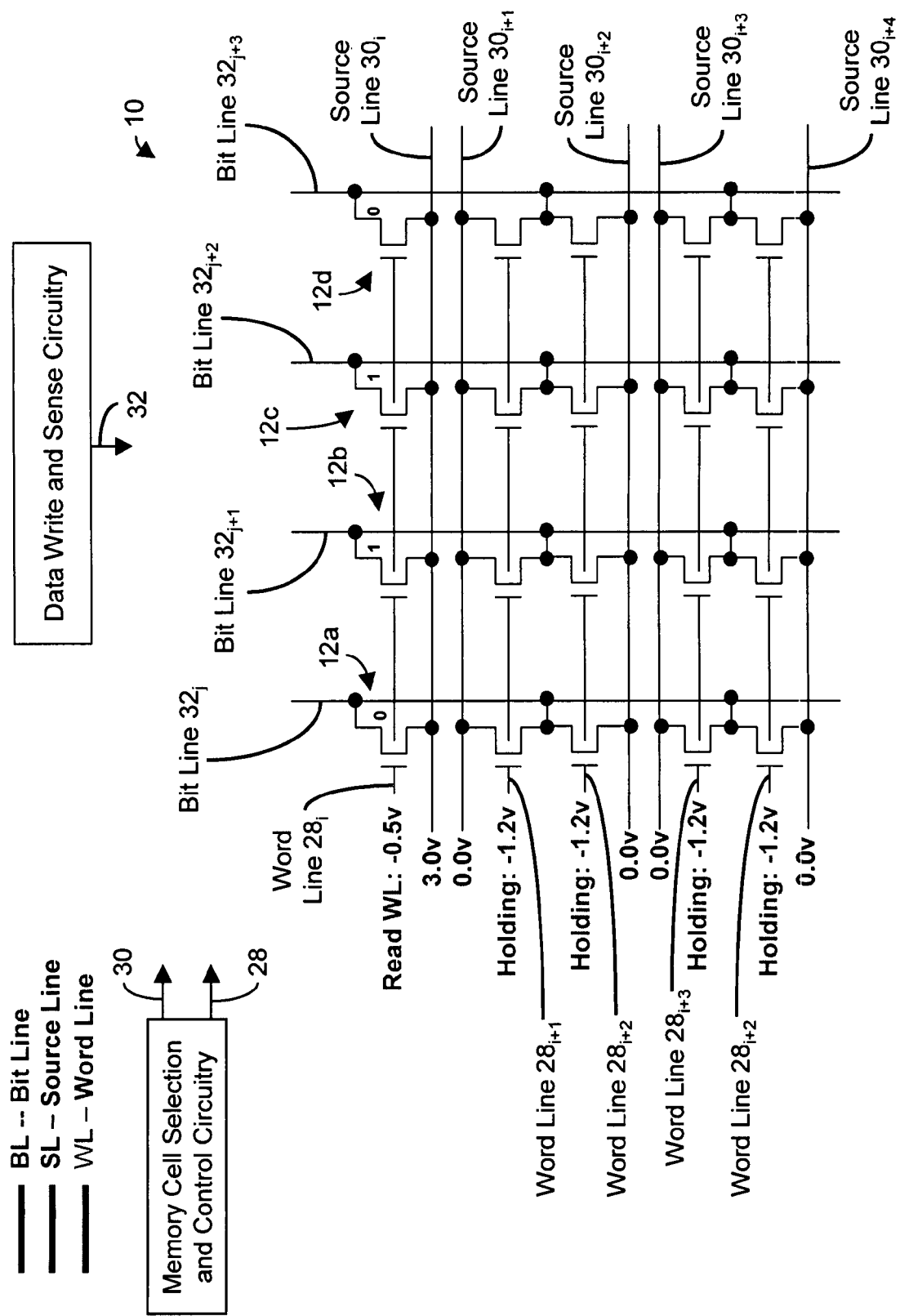

The plurality of memory cells 12 of the present inventions, which are read, controlled and/or operated as described above, may be implemented in any memory array having, for example, a plurality of rows and columns (for example, in a matrix form). For example, the plurality of memory cells 12 of the present inventions may be implemented in the memory arrays illustrated in FIGS. 12 and 13. Indeed, the present inventions may be implemented in any architecture, layout, and/or configuration employing such electrically floating body memory cells.

Notably, the reading technique described herein may reduce the degradation of the floating body charge caused by charge-pumping (charge-pumping disturb) thus allowing the quasi non-disturbing reading. As a result, when a memory cell is read multiple times without or before a refresh operation, the read window remains relatively stable for each successive read operation.

The present inventions may be implemented in any electrically floating body memory cell and memory cell array. For example, the present inventions include a memory array, having a plurality of memory cells each including an electrically floating body transistor, and/or technique of writing or programming data into one or more memory cells of such a memory array. As such, the data states of adjacent memory cells and/or memory cells that share a word line may be individually programmed.

Indeed, an electrically floating body transistor, whose state is read, programmed and/or refreshed using the techniques of the present inventions, may be implemented in the memory cell, architecture, layout, structure and/or configuration described and illustrated in the following provisional and non-provisional U.S. patent applications:

(1) U.S. Non-Provisional patent application Ser. No. 10/450,238, which was filed by Fazan et al. on Jun. 10, 2003 and entitled "Semiconductor Device" (now U.S. Pat. No. 6,969,662);

(2) U.S. Non-Provisional patent application Ser. No. 10/487,157, which was filed by Fazan et al. on Feb. 18, 2004 and entitled "Semiconductor Device" (now U.S. Pat. No. 7,061,050);

(3) U.S. Non-Provisional patent application Ser. No. 10/829,877, which was filed by Ferrant et al. on Apr. 22, 2004 and entitled "Semiconductor Memory Cell, Array, Architecture and Device, and Method of Operating Same" (now U.S. Pat. No. 7,085,153);

(4) U.S. Non-Provisional patent application Ser. No. 11/096,970, which was filed by Ferrant et al. and entitled "Semiconductor Memory Device and Method of Operating Same" (now U.S. Pat. No. 7,085,156);

(5) U.S. Non-Provisional patent application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (U.S. Patent Application Publication No. 2005/0063224);

(6) U.S. Non-Provisional patent application Ser. No. 11/304,387, which was filed by Okhonin et al. on Dec. 15, 2005 and entitled "Bipolar Reading Technique for a Memory Cell Having an Electrically Floating Body Transistor" (U.S. Patent Application Publication No. 2006/0131650);

(7) U.S. Non-Provisional patent application Ser. No. 11/453,594, which was filed by Okhonin et al. on Jun. 15, 2006 and entitled "Method for Reading a Memory Cell Having an Electrically Floating Body Transistor, and Memory Cell and Array Implementing Same" (U.S. Patent Application Publication No. 2007/0023833);

(8) U.S. Non-Provisional patent application Ser. No. 11/509,188, which was filed by Okhonin et al. filed on Aug. 24, 2006, and entitled "Memory Cell and Memory Cell Array Having an Electrically Floating Body Transistor, and Methods of Operating Same" (referred to above); and (9) U.S. Non-Provisional patent application Ser. No. 11/515,667, which was filed by Bauser on Sep. 5, 2006, and entitled "Method and Circuitry to Generate a Reference Current for Reading a Memory Cell, and Device Implementing Same".

The entire contents of these nine (9) U.S. patent applications, including, for example, the inventions, features, attributes, architectures, configurations, materials, techniques and advantages described and illustrated therein, are incorporated by reference herein. For the sake of brevity, those discussions will not be repeated; rather those discussions (text and illustrations), including the discussions relating to the memory cell, architecture, layout, structure, are incorporated by reference herein in its entirety.

Notably, the memory cells (having one or more transistors) may be controlled (for example, programmed or read) using any of the control circuitry described and illustrated in the above-referenced nine (9) U.S. patent applications. For the sake of brevity, those discussions will not be repeated and are incorporated herein by reference. Indeed, all memory cell selection and control circuitry, and techniques for programming, reading, controlling and/or operating memory cells including transistors having electrically floating body regions, whether now known or later developed, are intended to fall within the scope of the present inventions.

For example, the data stored in or written into memory cells 12 of DRAM array/device 10 may be read using well known circuitry and techniques (whether conventional or not), including those described in the above-referenced nine (9) U.S. patent applications. The present inventions may also employ read circuitry and techniques like that described and illustrated in U.S. patent application Ser. No. 10/840,902, which was filed by Portmann et al. on May 7, 2004, and entitled "Reference Current Generator, and Method of Programming, Adjusting and/or Operating Same" (now U.S. Pat. No. 6,912,150).

In addition, the present inventions may employ the read operation techniques like that described and illustrated in U.S. patent application Ser. No. 11/515,667, which was filed by Bauser on Sep. 5, 2006, and entitled "Method and Circuitry to Generate a Reference Current for Reading a Memory Cell, and Device Implementing Same". The entire contents of the U.S. patent application Ser. No. 11/515,667 are incorporated herein by reference.

Moreover, analog-to-digital converter circuitry and/or one or more sense amplifiers (not illustrated) may be employed to read the multi-bit data stored in a memory cell (having an electrically floating body transistor). The sense amplifier may sense the data state stored in the memory cell using voltage or current sensing techniques. In the context of a current sense amplifier, the current sense amplifier may compare the cell current to one or more reference currents, for example, the current of a reference cell (not illustrated). From that comparison, the data state of the memory cell may be determined (which is indicative of the number of majority carriers contained within electrically floating body region of the transistor).

Figure 20A:
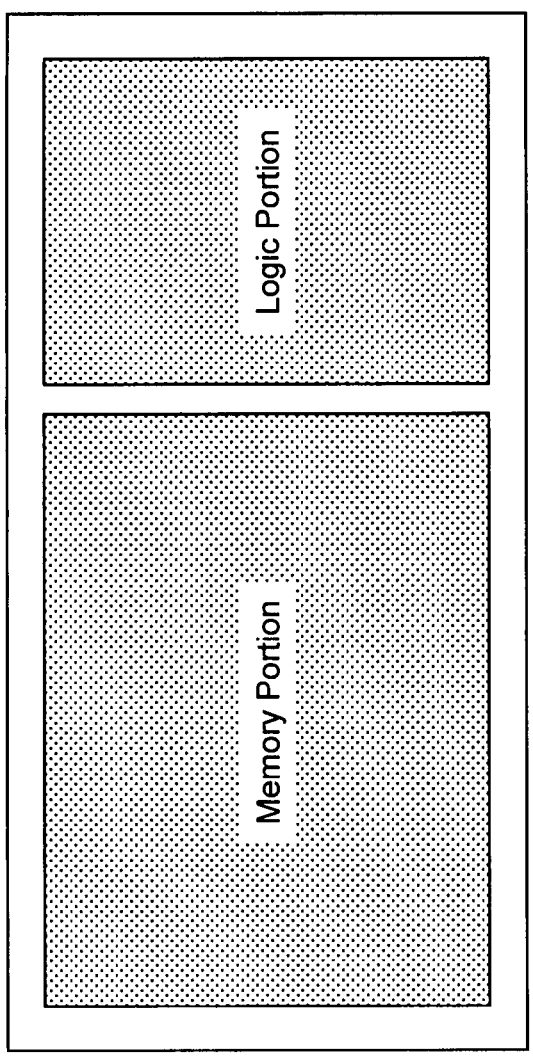
FIGS. 20A and 20B are schematic block diagram illustrations of exemplary integrated circuit devices in which the memory cell array (and certain peripheral circuitry) may be implemented, according to certain aspects of the present inventions.
Figure 20B:
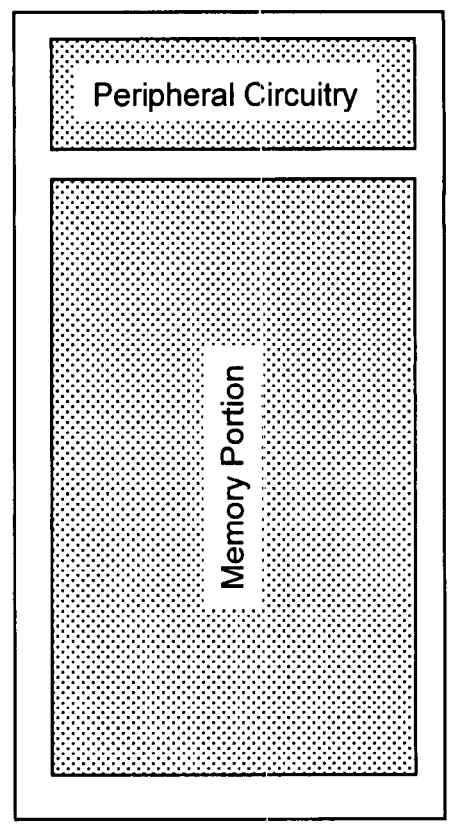

As noted above, the memory cell and/or memory cell array, as well as the circuitry of the present inventions may be implemented in an integrated circuit device having a memory portion and a logic portion (see, for example, FIG. 20A), or an integrated circuit device that is primarily a memory device (see, for example, FIG. 20B). The memory array may include a plurality of memory cells arranged in a plurality of rows and columns wherein each memory cell includes an electrically floating body transistor. The memory arrays may be comprised of N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

Figure 20C:
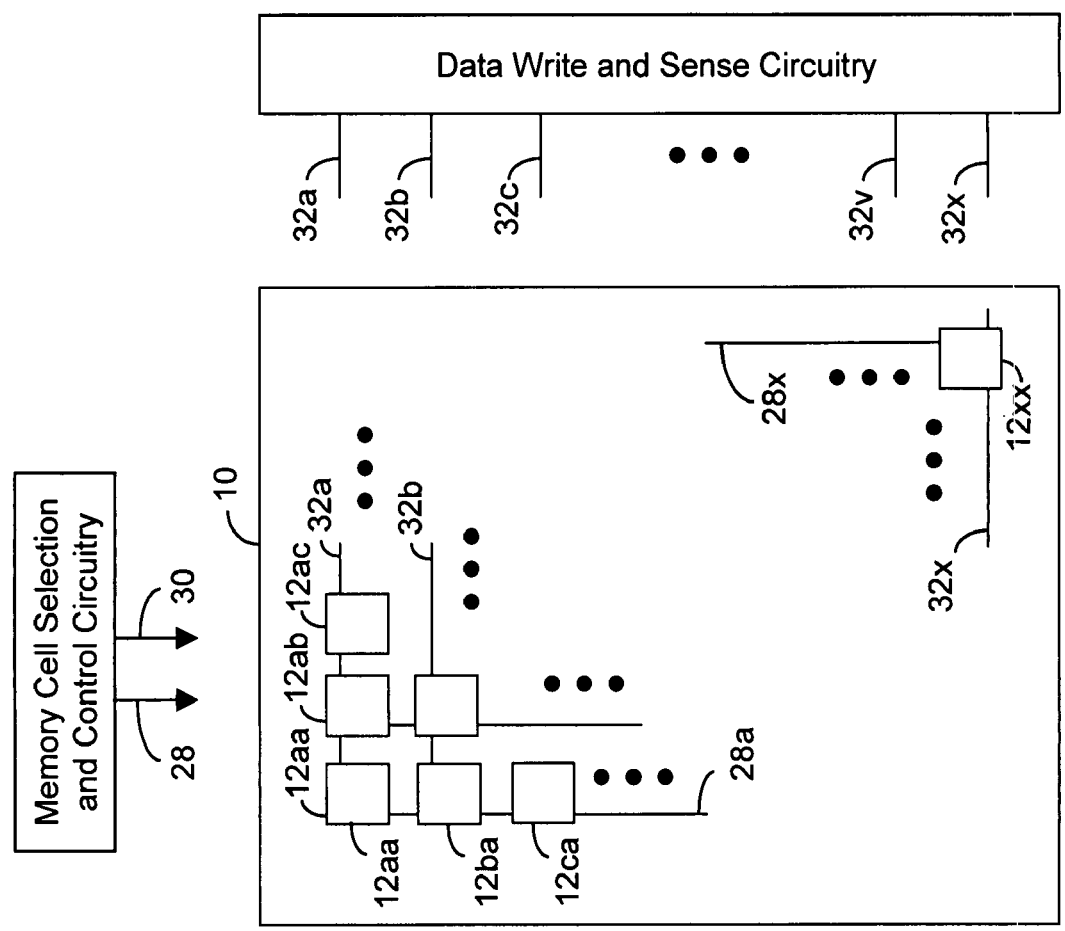
FIGS. 20C-20E are schematic block diagrams of embodiments of an integrated circuit device including, among other things, a memory cell array, data sense and write circuitry, memory cell selection and control circuitry, according to certain aspects of the present inventions.
Figure 20D:
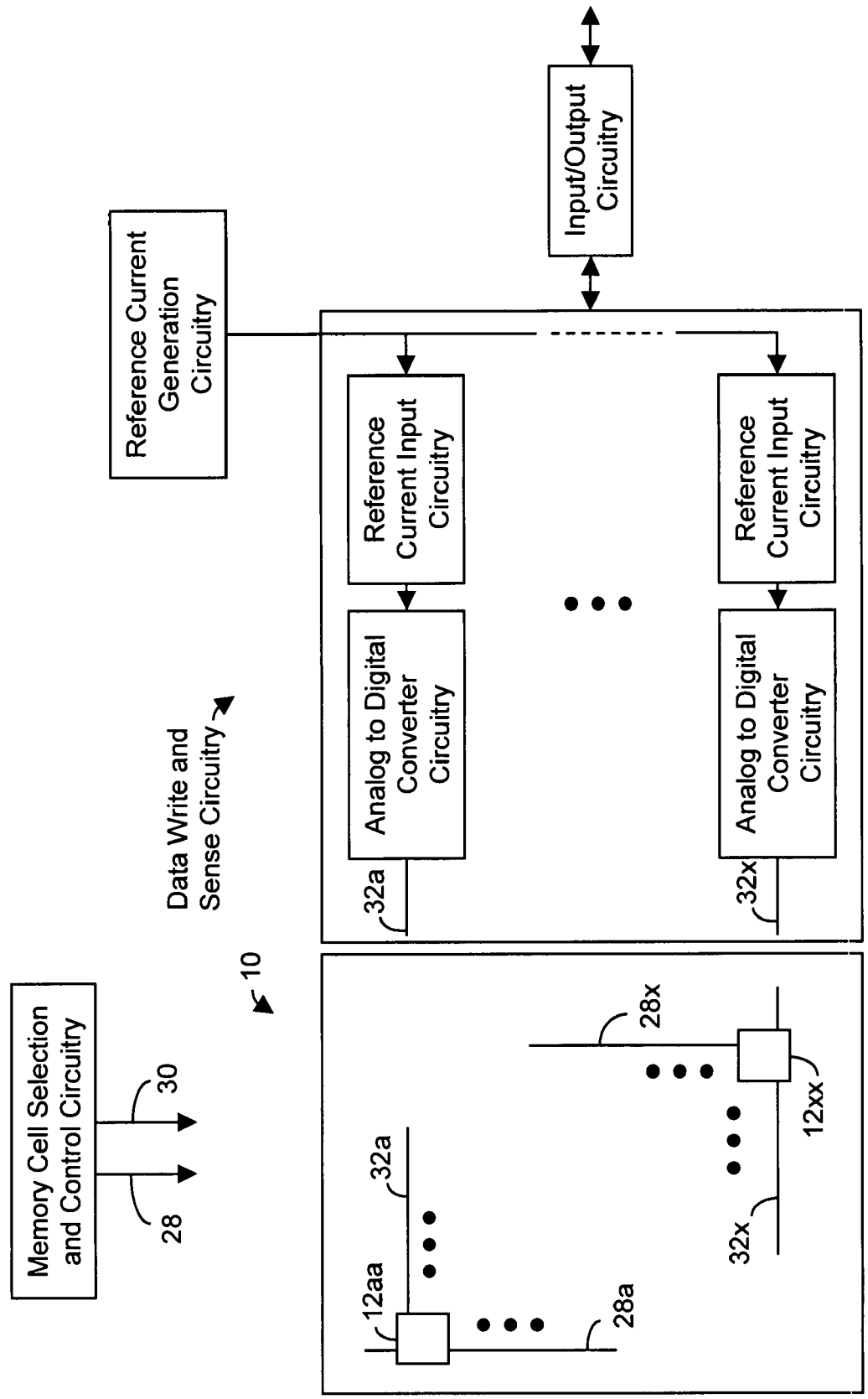
Figure 20E:
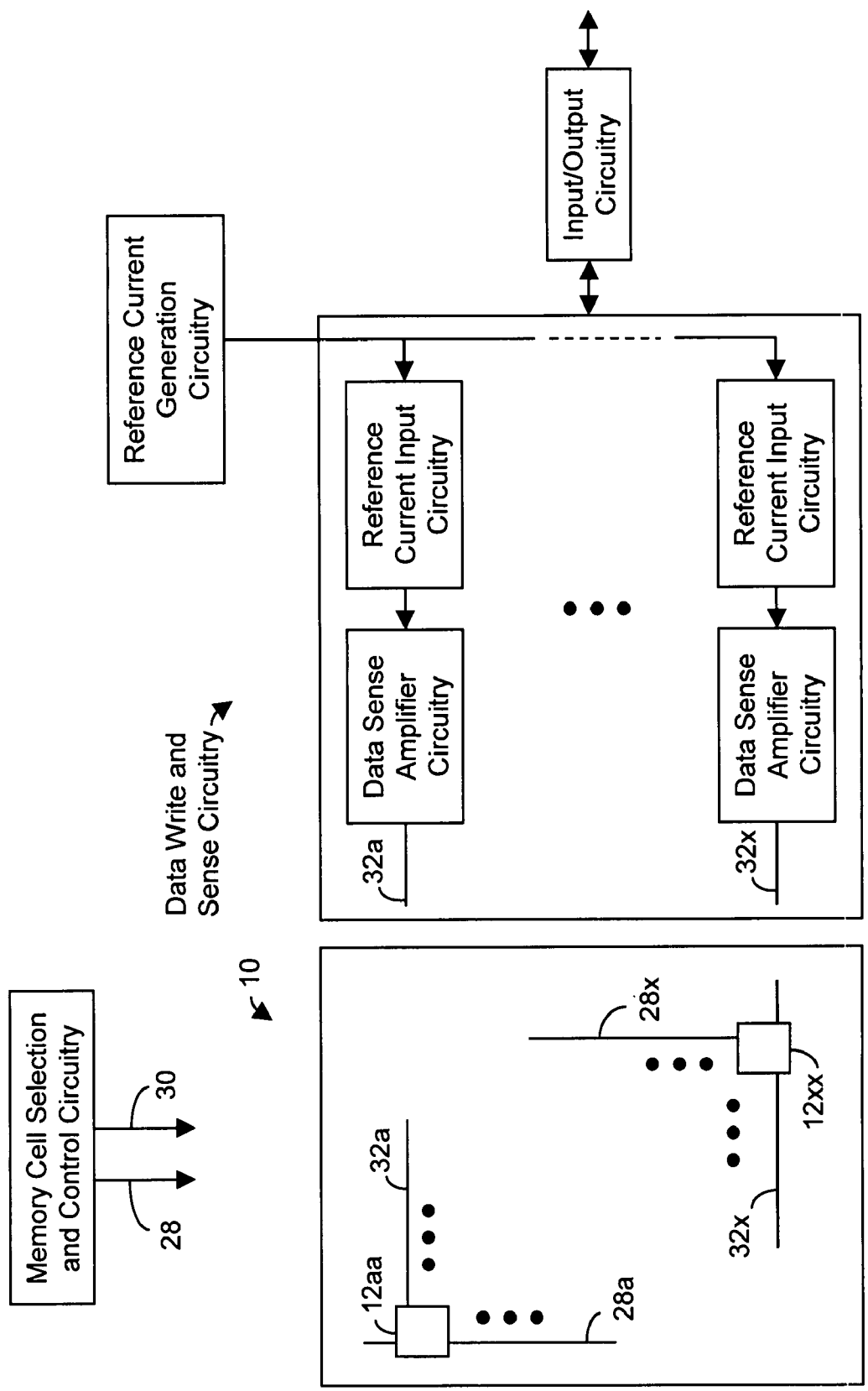

For example, with reference to FIGS. 20C, 20D and 20E, the integrated circuit device may include array 10, having a plurality of memory cells 12, data write and sense circuitry, and memory cell selection and control circuitry. The data write and sense circuitry reads data from and writes data to selected memory cells 12. In one embodiment, data write and sense circuitry includes analog-to-digital converter circuitry. (See, FIGS. 20C and 20D). In this regard, the analog-to-digital converter circuitry may include an n-bit analog-to-digital converter (where "n" may be equal to the number of bits stored in the memory cell).

In another embodiment, data write and sense circuitry includes a plurality of data sense amplifiers.(FIGS. 20C and 20E) Each data sense amplifier receives at least one bit line 32 and an output of reference generator circuitry (for example, a current or voltage reference signal). In one embodiment, the data sense amplifier may be a plurality of cross-coupled type sense amplifiers like the cross-coupled type sense amplifier described and illustrated in the Non-Provisional U.S. patent application Ser. No. 11/299,590 (U.S. Patent Application Publication US 2006/0126374), filed by Waller and Carman, on Dec. 12, 2005, and entitled "Sense Amplifier Circuitry and Architecture to Write Data into and/or Read Data from Memory Cells", the application being incorporated herein by reference in its entirety) to sense the data state stored in memory cell 12 and/or write-back data into memory cell 12.

It should be further noted that while each memory cell 12 in the exemplary embodiments (described above) includes one transistor 14, memory cell 12 may include a plurality of transistors (including one or more transistors having an electrically floating body region to store a charge which is representative of a data state). For example, the memory cell may employ two or more transistors, wherein each transistor includes an electrically floating body region to store a charge (for example, majority carriers in the storage node—i.e., the floating body region of the memory cell) that is representative of more than two states, for example, three states in each transistor. (See, for example, FIG. 21A wherein the memory cell in this exemplary embodiment is comprised of two transistors each capable of storing three states). The data or logic state of the memory cell is determined by the "combination" of the states of all the transistors. Thus, in this embodiment, the multi-bit memory cell is comprised of two or more transistors that each are capable of storing three, four, five or more data or logic states wherein the data or logic state of the memory cell is determined by the combination of the states of all of the transistors. (See, for example, FIGS. 21A-21C and U.S. application Ser. No. 10/829,877, which was filed by Ferrant et al. on Apr. 22, 2004 and entitled "Semiconductor Memory Cell, Array, Architecture and Device, and Method of Operating Same" (U.S. Patent Application Publication No. 2005/0013163, now U.S. Pat. No. 7,085,153, which is incorporated by reference herein)).

As noted above, the present inventions may be employed or implemented in conjunction with one or more of the inventions, memory cells, memory arrays and memory devices, and techniques for programming, reading, controlling and/or operating a semiconductor memory cell, array and device of the following provisional U.S. patent applications:

(1) U.S. Non-Provisional patent application Ser. No. 11/304,387, which was filed by Okhonin et al. on Dec. 15, 2004 and entitled "Bipolar Reading Technique for a Memory Cell Having an Electrically Floating Body Transistor" (U.S. Patent Application Publication No. 2006/0131650);

(2) U.S. Non-Provisional patent application Ser. No. 11/509,188, which was filed by Okhonin et al. filed on Aug. 24, 2006, and entitled "Memory Cell and Memory Cell Array Having an Electrically Floating Body Transistor, and Methods of Operating Same" (referred to above); and The entire contents of these two (2) U.S. applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in their entirety.

The electrically floating memory cells, transistors and/or memory array(s) may be fabricated using well known techniques and/or materials. Indeed, any fabrication technique and/or material, whether now known or later developed, may be employed to fabricate the electrically floating body memory cells, transistors and/or memory array(s). For example, the present inventions may employ silicon (whether bulk-type or SOI), germanium, silicon/germanium, gallium arsenide or any other semiconductor material in which transistors may be formed. Indeed, the electrically floating transistors, memory cells, and/or memory array(s) may employ the techniques described and illustrated in non-provisional patent application entitled "Integrated Circuit Device, and Method of Fabricating Same", which was filed on Jul. 2, 2004, by Fazan, Ser. No. 10/884,481 and/or non-provisional patent application entitled "One Transistor Memory Cell having a Strained Electrically Floating Body Region, and Method of Operating Same", which was filed on Oct. 12, 2006, and assigned Ser. No. 11/580,169, by Bassin (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Indeed, memory array 10 (including SOI memory transistors) may be integrated with SOI logic transistors, as described and illustrated in the Integrated Circuit Device Patent Applications. For example, in one embodiment, an integrated circuit device includes memory section (having, for example, PD or FD SOI memory transistors 14) and logic section (having, for example, high performance transistors, such as FinFET, multiple gate transistors, and/or non-high performance transistors (for example, single gate transistors that do not possess the performance characteristics of high performance transistors—not illustrated)). Again, the entire contents of the Integrated Circuit Device Patent Applications, including, for example, the inventions, features, attributes, architectures, configurations, materials, techniques and advantages described and illustrated therein, are hereby incorporated by reference.

Further, the memory arrays may be comprised of N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include fully depleted type transistors (whether P-channel and/or N-channel type). Alternatively, such circuitry may include partially depleted type transistors (whether P-channel and/or N-channel type). There are many techniques to integrate both partially depleted and/or fully depleted type transistors on the same substrate (see, for example, U.S. Non-Provisional patent application Ser. No. 10/487,157, which was filed by Fazan et al. on Feb. 18, 2004 and entitled "Semiconductor Device" (U.S. Patent Application Publication No. 2004/0238890)). All such techniques, whether now known or later developed, are intended to fall within the scope of the present inventions.

Notably, electrically floating body transistor 14 of memory cell 12 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line which is coupled to (data sense circuitry (for example, a sense amplifier and/or an analog-to-digital converter).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, in another embodiment, the present inventions may employ encoding and/or decoding to enhance the effective size of the data storage of the memory array and/or integrated circuit. In this regard, where a memory cell stores four possible states, that memory cell may store two bits of data. Similarly, where the memory cell stores three possible data states that memory cell may store one and one-half bits of data. However, where encoding is implemented in conjunction with the memory cell, memory cell array, integrated circuit and methods of the present inventions, encoding and/or decoding, for example, grouping or associating a plurality of memory cells via encoding/decoding, may enhance the effective memory size of the memory array and/or integrated circuit such that more bits of data may tie stored in the memory array and/or integrated circuit than where no encoding/decoding is employed.

Figure 22A:
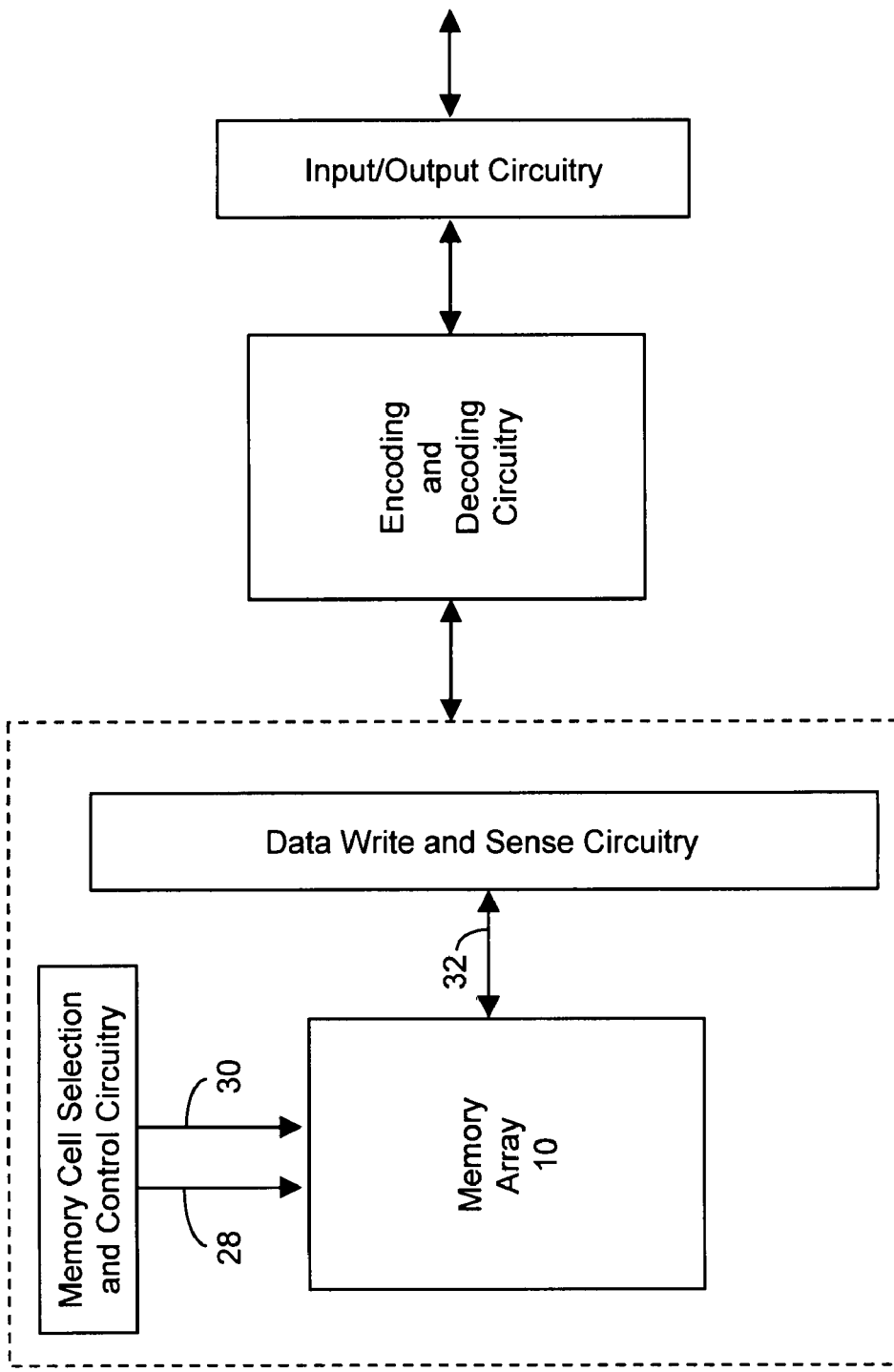
FIGS. 22A and 22B are schematic block diagrams of embodiments of an integrated circuit device including, among other things, a memory cell array, data sense and write circuitry, memory cell selection and control circuitry, and encoding and decoding circuitry, according to certain aspects of the present inventions.
Figure 22B:
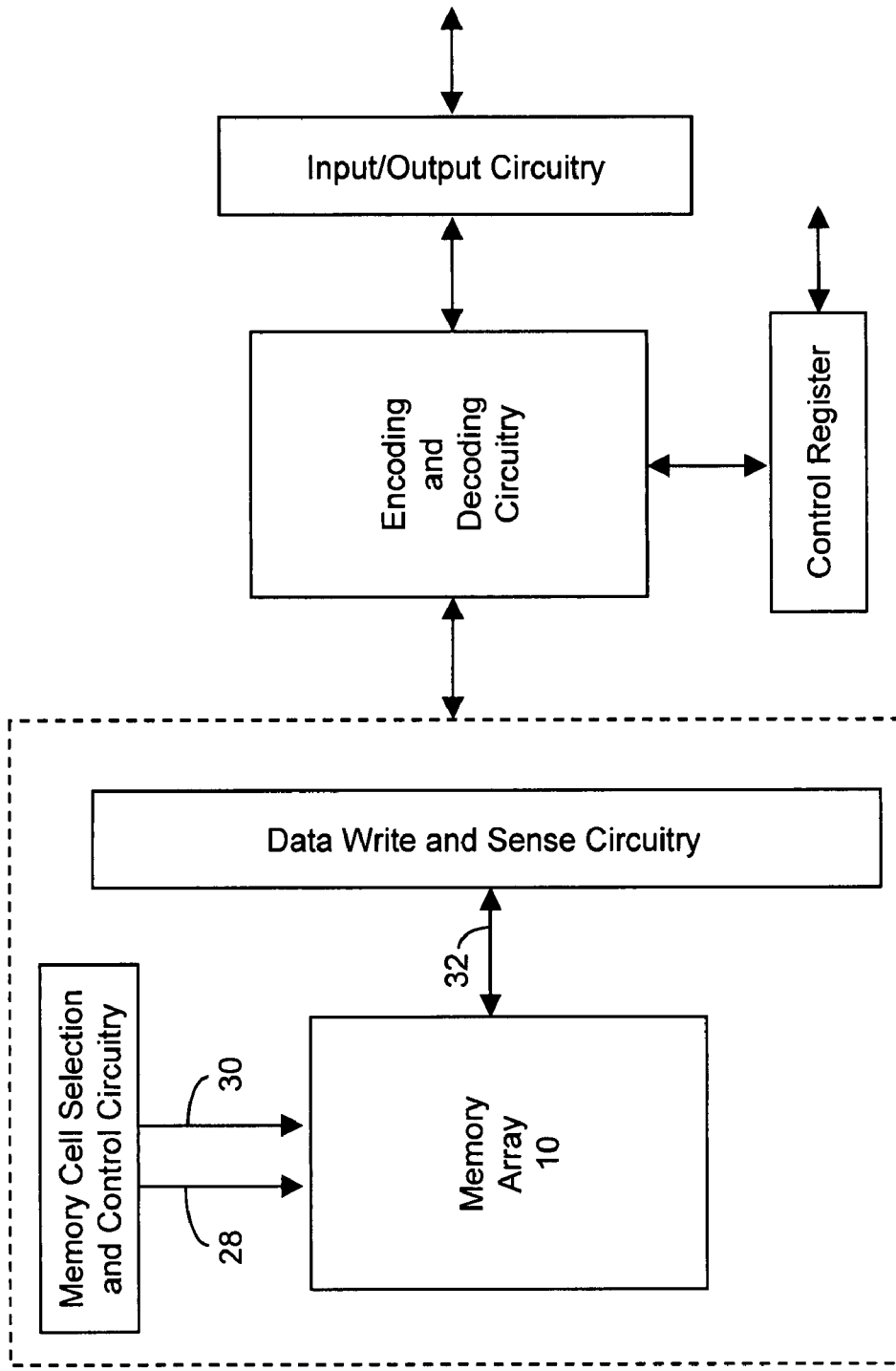

With reference to FIGS. 22A and 22B, the present inventions may include encoding and decoding circuitry to implement an encoding/decoding technique according to certain aspects of the present inventions. The encoding/decoding technique may be pre-set, pre-programmed and/or programmable (in, for example, a state machine, discrete logic (for example, CMOS logic), and/or PGA). In this regard, the encoding/decoding technique may be hardwired or programmable. Indeed, different techniques may be hardwired or programmed into the integrated circuit and one of the techniques may be selected during fabrication, test, calibration and/or operation. Here, the encoding and decoding circuitry may access a control register (for example, fuses, anti-fuses, DRAM, SRAM, EEPROM, latch and/or register) to provide control information to the encoding and decoding circuitry to implement a desired, selected and/or predetermined encoding/decoding technique during normal operation. Notably, there are many different types of encoding/decoding techniques that may be employed; all such techniques (whether now known or later developed) are intended to fall within the scope of the present invention.

The encoding and/or decoding circuitry (for example, a state machine, discrete logic (for example, CMOS logic), and/or PGA) may be "on-chip" (i.e., on the same substrate as, for example, memory array 10) or "off-chip" (i.e., on a different substrate as, for example, memory array 10). Indeed, there are many different types and configurations of encoding and decoding circuitry that may be employed; all such circuitry (whether now known or later developed) are intended to fall within the scope of the present invention.

As noted above, there are many different types of encoding/decoding techniques that may be employed. For example, in one embodiment, sense circuitry may include a plurality of sense amplifiers which, in response to an input, output two signals. A first output signal may be designated as "L" (i.e. the charge in the memory cell is greater than a threshold value defining the difference between the least-charged state and the middle state) and a second output signal may be designed as "M" (i.e., the charge in the memory cell is greater than a threshold value defining the difference between the middle state and the most-charged state). Thus, the state table for sensing the three states of the memory cell may be characterized as:

| Least charged state | $L = 0, M = 0$ |
| Middle charged state | $L = 1, M = 0$ |
| Most charged state | $L = 1, M = 1$ |

Under these circumstances, by combining the sense amplifier signals from associated memory cells, via logic circuitry, three bits of information (RD2, RD1, RD0) may be decoded from associated memory cells.

$$RD2 = (LA.LB) + (LA.\text{NOT}(MB))$$

$$RD1 = MA + (LA.LB)$$

$$RD0 = MA + (LB.\text{NOT}(MB))$$

where,
LA, MA are the output signals L and M of the sense amplifiers from one memory cell of the associated memory cells, and
LB, MB are the output signals L and M of the sense amplifiers from the second memory cell of the associated memory cells.

The output signals may be logically combined using, for example, a microprocessor, microcontroller, state machine, discrete logic (for example, CMOS logic), and/or PGA; indeed, any circuitry whether now known or later developed is intended to fall within the scope of the present invention.

Further, data write circuitry may include three sets of input control signals. The first set of input signals may be designated as "Z" (i.e., a signal to store the least-charged state in the memory cell), the second set of input signals may be designated as "S" (i.e., a signal to store the middle-charged state in the memory cell), and the third set of input signal may be designated as "H" (i.e., a signal to store the most-charged state in the memory cell). Thus, the state table for writing the three states of the memory cell may be characterized as:

| Least charged state | $Z = 1, S = 0, H = 0$ |
| Middle charged state | $Z = 0, S = 1, H = 0$ |
| Most charged state | $Z = 0, S = 0, H = 1$ |

By controlling the write signals from/of associated or grouped memory cells, via logic circuitry, three bits of information (WD2, WD1, WD0) may be encoded into each of the associated memory cells so that the same three bits of information may be recovered (RD2, RD1, RD0) using the read decoding technique described above.

$$HA = WD1.WD0$$

$$SA = WD2 + (WD1.WD0)$$

$$ZA = \text{NOT}(WD2).\text{NOT}(WD1.WD0)$$

$$HB = WD1.\text{NOT}(WD0)$$

$$SB = (WD1 + WD0).(WD2 + \text{NOT}(WD1.WD0))$$

$$ZB = \text{NOT}(WD1 + WD0).(\text{NOT}(WD2) + WD1.WD0)$$

where,
ZA, SA, HA are the write control signals Z, S and H for one of the memory cells of the pair; and
ZB, SB, HB are the write control signals Z, S and H for the second memory cell of the associated memory cells.

Notably, the encoding and/or decoding techniques described herein may be implemented in conjunction with any memory cell technology, whether now known or later developed. For example, the memory cells may include one or more electrically floating body transistors, one transistor-one capacitor architecture, electrically floating gate transistors, junction field effect transistors (often referred to as JFETs), or any other memory/transistor technology whether now known or later developed. All such memory technologies are intended to fall within the scope of the present inventions.

Moreover, the encoding and/or decoding techniques of the present inventions may be implemented in conjunction with any type of memory (including discrete or integrated with logic devices), whether now known or later developed. For example, the memory may be a DRAM, SRAM and/or Flash. All such memories are intended to fall within the scope of the present inventions.

As noted above, in one aspect, the present inventions are directed to, among other things, techniques for reading, controlling and/or operating a semiconductor memory cell, array, architecture and device including electrically floating body transistors which allow multi-bit storage/reading. The present inventions are also directed to semiconductor memory cell, array, architecture and device that include circuitry to implement such reading, controlling and/or operating techniques. In addition, the present inventions are also directed to techniques of encoding and/or decoding data within the memory cell (for example, an odd number of data states or non-integer bits of data) to enhance the effective size of the data storage of the memory array and/or integrated circuit. Indeed, as mentioned above, the present inventions may employ encoding and/or decoding to enhance the effective size of the data storage of the memory array including a data write and sense circuitry and a plurality of memory cells, each having an electrically floating body transistor capable of multi-bit storage/writing/reading.

The present inventions may be implemented in, among other things, any electrically floating body memory cell and memory cell array. (See, for example, the Background section above). Indeed, in certain aspects, the present inventions are a memory array, having a plurality of memory cells each including an electrically floating body transistor, and/or technique of writing or programming data into one or more memory cells of such a memory array. In this aspect of the inventions, the data states of adjacent memory cells and/or memory cells that share a word line may be individually programmed.

As noted above, the memory cell and/or memory cell array, as well as the circuitry of the present inventions may be implemented in an integrated circuit device having a memory portion and a logic portion, or an integrated circuit device that is primarily a memory device. The memory array may include a plurality of memory cells arranged in a plurality of rows and columns wherein each memory cell includes an electrically floating body transistor. The memory arrays may be comprised of N-channel, P-channel and/or both types of transistors. Indeed, circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells 12 in the memory array(s), suitable write and read voltages (for example, negative voltages) are well known to those skilled in the art in light of this disclosure. Accordingly, for the sake of brevity, these discussions will not be repeated.

The above embodiments of the inventions are merely exemplary. They are not intended to be exhaustive or to limit the inventions to the precise forms, techniques, materials and/or configurations disclosed. Many modifications and variations are possible and it is to be understood that other embodiments may be utilized and operational changes may be made without departing from the scope of the present inventions. The scope of the inventions is not limited solely to the description above because the description of the above embodiments has been presented for the purposes of exemplary illustration/description.

What is claimed is:

1. An integrated circuit device comprising:
   a memory cell including an electrically floating body transistor, wherein the electrically floating body transistor includes:
      a source region;
      a drain region;
      a body region disposed between the source region and the drain region, wherein the body region is electrically floating; and
      a gate disposed over the body region;
   wherein the memory cell includes:
      (i) a first data state which is representative of a first charge in the body region of the electrically floating body transistor;
      (ii) a second data state which is representative of a second charge in the body region of the electrically floating body transistor; and
      (iii) a third data state which is representative of a third charge in the body region of the electrically floating body transistor; and
   data write circuitry, coupled to the memory cell, to apply (i) first write control signals to the memory cell to write the first data state therein, (ii) second write control signals to the memory cell to write the second data state therein, and (iii) third write control signals to the memory cell to write the third data state therein; and
   wherein, in response to:
      the first write control signals applied to the memory cell, the electrically floating body transistor thereof generates a first bipolar transistor current which substantially provides the first charge in the body region of the electrically floating body transistor, and
      the second write control signals applied to the memory cell, the electrically floating body transistor thereof generates a second bipolar transistor current which substantially provides the second charge in the body region of the electrically floating body transistor.

2. The integrated circuit device of claim 1 wherein the memory cell consists essentially of the electrically floating body transistor.

3. The integrated circuit device of claim 1 wherein the first write control signals include:
   (1) a first temporally changing signal applied to the gate, and
   (2a) a second temporally changing signal applied to the source region, or (2b) a second temporally changing signal applied to the drain region.

4. The integrated circuit device of claim 1 wherein:
   the first write control signals include a first temporally changing signal applied to the source region;
   the second write control signals include a second temporally changing signal applied to the source region; and
   the third write control signals include a third temporally changing signal applied to the source region.

5. The integrated circuit device of claim 4 wherein:
   the first temporally changing signal includes a first voltage having a first amplitude and a second voltage having a second amplitude; and
   the second temporally changing signal includes the first voltage having the first amplitude and a third voltage having a third amplitude; and
   the third temporally changing signal includes the first voltage having the first amplitude and a fourth voltage having a fourth amplitude.

6. The integrated circuit device of claim 1 wherein:
   the first write control signals include a first temporally changing signal applied to the drain region;
   the second write control signals include a second temporally changing signal applied to the drain region; and
   the third write control signals include a third temporally changing signal applied to the drain region.

7. The integrated circuit device of claim 6 wherein:
the first temporally changing signal includes a first voltage having a first amplitude and a second voltage having a second amplitude; and
the second temporally changing signal includes the first voltage having the first amplitude and a third voltage having a third amplitude; and
the third temporally changing signal includes the first voltage having the first amplitude and a fourth voltage having a fourth amplitude.

8. The integrated circuit device of claim 1 wherein the signal applied to the gate temporally changes relative to the signal applied to the drain region to cause, provide, produce and/or induce the majority carriers to accumulate in a portion of the electrically floating body region that is juxtaposed or near a gate dielectric which is disposed between the gate and the electrically floating body region.

9. The integrated circuit device of claim 8 wherein the signal applied to the gate changes or terminates before the signal applied to the drain region.

10. The integrated circuit device of claim 1 wherein the gate of the electrically floating body transistor being disposed over the body region includes being disposed above the body region.

11. The integrated circuit device of claim 1 further including:
data sense circuitry, coupled to the memory cell, to sense the data state of the memory cell; and
wherein, in response to read control signals applied to the memory cell, the electrically floating body transistor generates a read bipolar transistor current which is representative of the data state of the memory cell and wherein the data sense circuitry determines the data state of the memory cell at least substantially based on the read bipolar transistor current.

12. The integrated circuit device of claim 11 wherein the read control signals include a signal applied to the gate, source region, and drain region to cause, force and/or induce the read bipolar transistor current which is representative of the data state of the memory cell and wherein the signal applied to the source region includes a positive voltage pulse.

13. The integrated circuit device of claim 11 wherein the read control signals include a signal applied to the gate, source region, and drain region to cause, force and/or induce the read bipolar transistor current which is representative of the data state of the memory cell and wherein the signal applied to the gate includes a negative voltage pulse.

14. An integrated circuit device comprising:
a memory cell array including a:
plurality of word lines;
plurality of source lines;
plurality of bit lines; and
plurality of memory cells arranged in a matrix of rows and columns, wherein each memory cell includes an electrically floating body transistor, wherein the electrically floating body transistor includes:
a source region coupled to an associated source line;
a drain region coupled to an associated bit line
a body region disposed between the source region and the drain region, wherein the body region is electrically floating;
a gate disposed over the body region and coupled to an associated word line; and
wherein each memory cell includes more than three data states, including:
(i) a first data state which is representative of a first charge in the body region of the electrically floating body transistor;
(ii) a second data state which is representative of a second charge in the body region of the electrically floating body transistor;
(iii) a third data state which is representative of a third charge in the body region of the electrically floating body transistor; and
(iv) a fourth data state which is representative of a fourth charge in the body region of the electrically floating body transistor; and
data write circuitry, coupled to each of the memory cells, to apply (i) first write control signals to the memory cells to write the first data state therein, (ii) second write control signals to the memory cells to write the second data state therein, (iii) third write control signals to the memory cells to write the third data state therein and (iv) fourth write control signals to the memory cells to write the fourth data state therein; and
wherein, in response to:
the first write control signals applied to a selected memory cell, the electrically floating body transistor thereof generates a first bipolar transistor current which substantially provides the first charge in the body region of the electrically floating body transistor,
the second write control signals applied to the selected memory cell, the electrically floating body transistor thereof generates a second bipolar transistor current which substantially provides the second charge in the body region of the electrically floating body transistor, and
the third write control signals applied to the selected memory cell, the electrically floating body transistor thereof generates a third bipolar transistor current which substantially provides the third charge in the body region of the electrically floating body transistor.

15. The integrated circuit device of claim 14 wherein each memory cell consists essentially of the associated electrically floating body transistor.

16. An integrated circuit device comprising:
a memory cell array including a:
plurality of word lines;
plurality of source lines;
plurality of bit lines; and
plurality of memory cells arranged in a matrix of rows and columns, wherein each memory cell includes an electrically floating body transistor, wherein the electrically floating body transistor includes:
a source region coupled to an associated source line;
a drain region coupled to an associated bit line;
a body region disposed between the source region and the drain region, wherein the body region is electrically floating;
a gate disposed over the body region and coupled to an associated word line; and
wherein each memory cell includes more than two data states, including:
(i) a first data state which is representative of a first charge in the body region of the electrically floating body transistor;

(iii) a second data state which is representative of a second charge in the body region of the electrically floating body transistor; and (iii) a third data state which is representative of a third charge in the body region of the electrically floating body transistor; and data sense circuitry, coupled to the plurality of memory cells, to sense the data state of the plurality of memory cells; and wherein, in response to read control signals applied to a selected memory cells, the electrically floating body transistor of the selected memory cell generates a read bipolar transistor current which is representative of the data state of the selected memory cell and wherein the data sense circuitry determines the data state of the selected memory cell at least substantially based on the read bipolar transistor current.

17. The integrated circuit device of claim 16 wherein the read control signals include a signal applied to the gate, source region, and drain region of a transistor of the selected memory cell to cause, force and/or induce the read bipolar transistor current which is representative of the data state of the selected memory cell and wherein the signal applied to the gate of the associated transistor includes a positive voltage pulse.

18. The integrated circuit device of claim 16 wherein the read control signals include a signal applied to the gate, source region, and drain region of a transistor of the selected memory cell to cause, force and/or induce the read bipolar transistor current which is representative of the data state of the selected memory cell and wherein the signal applied to the gate of the associated transistor includes a negative voltage pulse.

19. The integrated circuit device of claim 16 further including data write circuitry, coupled to each of the memory cells, to apply (i) first write control signals to the selected memory cell to write the first data state therein, (ii) second write control signals to the selected memory cell to write the second data state therein, and (iii) third write control signals to the selected memory cell to write the third data state therein.

20. The integrated circuit device of claim 19 wherein, in response to:

the first write control signals applied to the selected memory cell, the electrically floating body transistor thereof generates a first bipolar transistor current which substantially provides the first charge in the body region of the electrically floating body transistor, and the second write control signals applied to the selected memory cell, the electrically floating body transistor thereof generates a second bipolar transistor current which substantially provides the second charge in the body region of the electrically floating body transistor.

21. The integrated circuit device of claim 14 wherein the gate of the electrically floating body transistor being disposed over the body region includes being disposed above the body region.

22. The integrated circuit device of claim 16 wherein the gate of the electrically floating body transistor being disposed over the body region includes being disposed above the body region.

23. The integrated circuit device of claim 1 wherein the data write circuitry includes means for applying (i) first write control signals to the memory cell for writing the first data state therein, (ii) second write control signals to the memory cell for writing the second data state therein, and (iii) third write control signals to the memory cell for writing the third data state therein.

24. The integrated circuit device of claim 14 wherein the data write circuitry includes means for applying (i) first write control signals to the memory cells for writing the first data state therein, (ii) second write control signals to the memory cells for writing the second data state therein, (iii) third write control signals to the memory cells for writing the third data state therein and (iv) fourth write control signals to the memory cells for writing the fourth data state therein.

25. The integrated circuit device of claim 16 wherein the data sense circuitry includes means for sensing the data state of the plurality of memory cells.

* * * * *